United States Patent
Obradovic et al.

(10) Patent No.: US 8,380,476 B2
(45) Date of Patent: *Feb. 19, 2013

(54) MODELING OF FERROELECTRIC CAPACITORS TO INCLUDE LOCAL STATISTICAL VARIATIONS OF FERROELECTRIC PROPERTIES

(75) Inventors: Borna Obradovic, McKinney, TX (US); Keith R. Green, Prosper, TX (US); Scott R. Summerfelt, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 581 days.

This patent is subject to a terminal disclaimer.

(21) Appl. No.: 12/568,910

(22) Filed: Sep. 29, 2009

(65) Prior Publication Data

US 2010/0299115 A1    Nov. 25, 2010

Related U.S. Application Data

(60) Provisional application No. 61/180,286, filed on May 21, 2009.

(51) Int. Cl.
*G06F 17/50* (2006.01)
*G06G 7/62* (2006.01)
(52) U.S. Cl. .......................... 703/13; 703/14
(58) Field of Classification Search .............. 703/13, 703/14
See application file for complete search history.

(56) References Cited

U.S. PATENT DOCUMENTS

| | | | | |
|---|---|---|---|---|
| 5,867,405 A * | 2/1999 | Jiang et al. | ......... | 703/5 |
| 6,008,659 A * | 12/1999 | Traynor | ......... | 324/658 |
| 6,327,558 B1 * | 12/2001 | Nishimura | ......... | 703/20 |
| 6,552,921 B2 * | 4/2003 | Tsai et al. | ......... | 365/145 |
| 7,149,137 B2 * | 12/2006 | Rodriguez et al. | ......... | 365/201 |
| 7,298,018 B2 * | 11/2007 | Ezhilvalavan et al. | ......... | 257/532 |
| 2010/0174513 A1 * | 7/2010 | Obradovic et al. | ......... | 703/2 |

OTHER PUBLICATIONS

Bartic, Andrei T.; Wouters, Dirk J.; Maes, Herman E.; Rickes, Jurgen T.; Waser, Rainer M.; , "Preisach model for the simulation of ferroelectric capacitors," Journal of Applied Physics, vol. 89, No. 6, pp. 3420-3425, Mar. 2001.*

Chao-gang Wei; Tian-ling Ren; Dan Xie; Zhi-Gang Zhang; Jun Zhu; Li-Tian Liu; , "A ferroelectric capacitor compact model for circuit simulation," Solid-State and Integrated Circuits Technology, 2004. Proceedings. 7th International Conference on , vol. 1, no., pp. 738-741 vol. 1, Oct. 18-21, 2004.*

(Continued)

*Primary Examiner* — Mary C Jacob
*Assistant Examiner* — Aniss Chad
(74) *Attorney, Agent, or Firm* — Rose Alyssa Keagy; Wade J. Brady, III; Frederick J. Telecky, Jr.

(57) ABSTRACT

Simulation of an electronic circuit including a model of a ferroelectric capacitor. The model of the ferroelectric capacitor includes a multi-domain ferroelectric capacitor, in which each of the domains is associated with a positive and a negative coercive voltage. A probability distribution function of positive and negative coercive voltages is defined, from which a weighting function of the distribution of domains having those coercive voltages is defined. To create a model of a small ferroelectric capacitor, a Poisson probability distribution is assigned to each of an array of gridcells defining the probability distribution function of positive and negative coercive voltages, and a number of domains assigned to each gridcell is randomly selected according to that Poisson distribution and an expected number of domains in the modeled capacitor for that gridcell, based on the area of the modeled capacitor. The electrical behavior of the ferroelectric capacitor is evaluated by evaluating the superposed polarization of each of the randomly selected domains.

24 Claims, 14 Drawing Sheets

OTHER PUBLICATIONS

Dunn, D.E.; , "A ferroelectric capacitor macromodel and parameterization algorithm for SPICE simulation," Ultrasonics, Ferroelectrics and Frequency Control, IEEE Transactions on , vol. 41, No. 3, pp. 360-369, May 1994.*

Kuhn, C.; Honigschmid, H.; Kowarik, O.; Gondro, E.; Hoffmann, K.;, "A dynamic ferroelectric capacitance model for circuit simulators ," Applications of Ferroelectrics, 2000. ISAF 2000. Proceedings of the 2000 12th IEEE International Symposium on , vol. 2, no., pp. 695-698 vol. 2, 2000.*

Le Grand de Mercey, G.; Kowarik, O.; , "Relaxation model for ferroelectric capacitors," Solid-State Device Research Conference, 2001. Proceeding of the 31st European , vol., no., pp. 367-370, Sep. 11-13, 2001.*

Wang, Longhai; Yu, Jun; Wang, Yunbo; Peng, Gang; Liu, Feng; Gao, Junxiong; , "Modeling ferroelectric capacitors based on the dipole switching theory," Journal of Applied Physics , vol. 101, No. 10, pp. 104505-104505-7, May 2007.*

Xiao-Hong Du; Bing Sheu; , "Modeling ferroelectric capacitors for memory applications," Circuits and Devices Magazine, IEEE , vol. 18, No. 6, pp. 10-16, Nov. 2002.*

Sheikholeslami et al., "A Survey of Behavioral Modeling of Ferroelectric Capacitors", Trans. Ultrasonics, Ferroelectrics, and Frequency Control, vol. 44, No. 4 (IEEE, Jul. 1997), pp. 917-924.

Jiang et al., "Computationally Efficient Ferroelectric Capacitor Model for Circuit Simulation", Digest of Technical Papers, Symposium on VLSI Technology, Paper 10B-4 (IEEE, 1997), pp. 141-142.

Kuhn et al., "A New Physical Model for the Relaxation in Ferroelectrics", Proceedings of the 30th European Solid-State Device Research Conference (IEEE, 2000), pp. 164-167.

Inoue et al., "Effect of Imprint on Operation and Reliability of Ferroelectric Random Access Memory", Trans. Elec. Devices, vol. 48, No. 10 (IEEE, 2001), pp. 2266-2272.

Nozawa et al., "Ferroelectric Dielectric Technology", Proc. of 6th Int'l Conference on Solid-State and Integrated Circuit Technology, vol. 1, (IEEE, 2001), pp. 687-691.

U.S. Appl. No. 12/394,849, filed Feb. 27, 2009, entitled "Characterization and Modeling of Ferroelectric Capacitors".

* cited by examiner

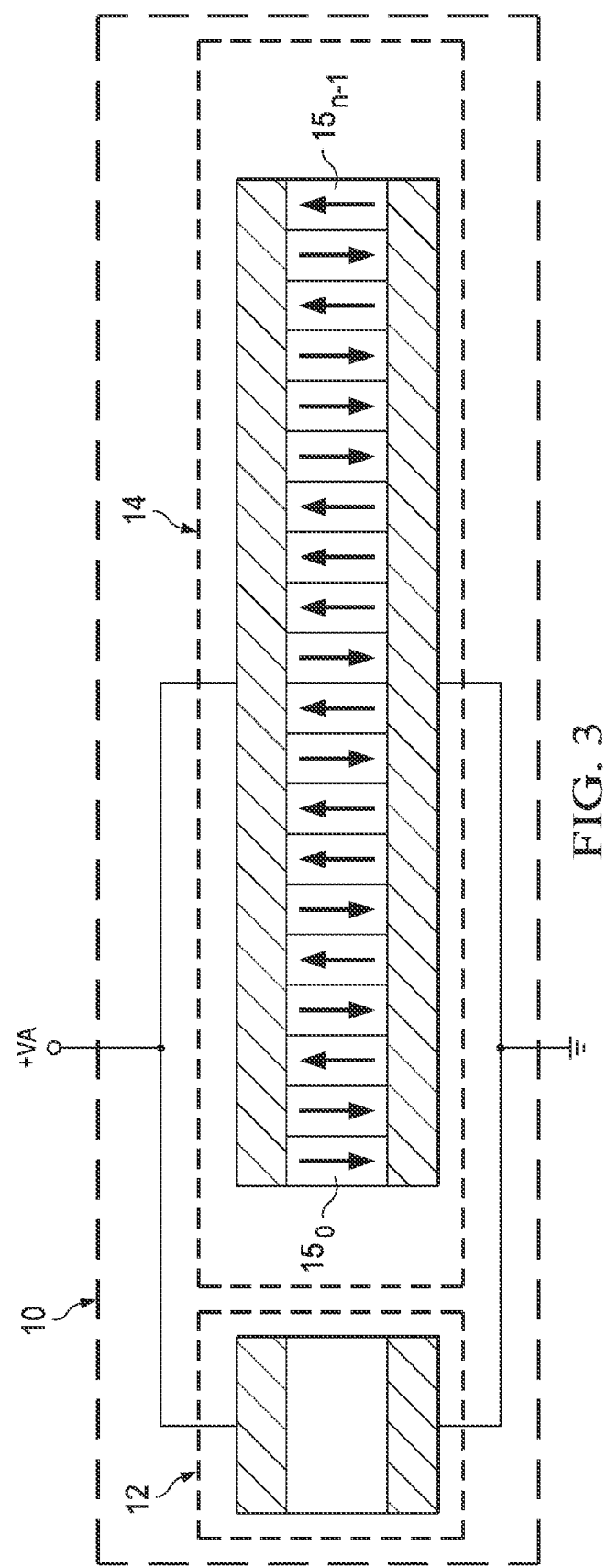

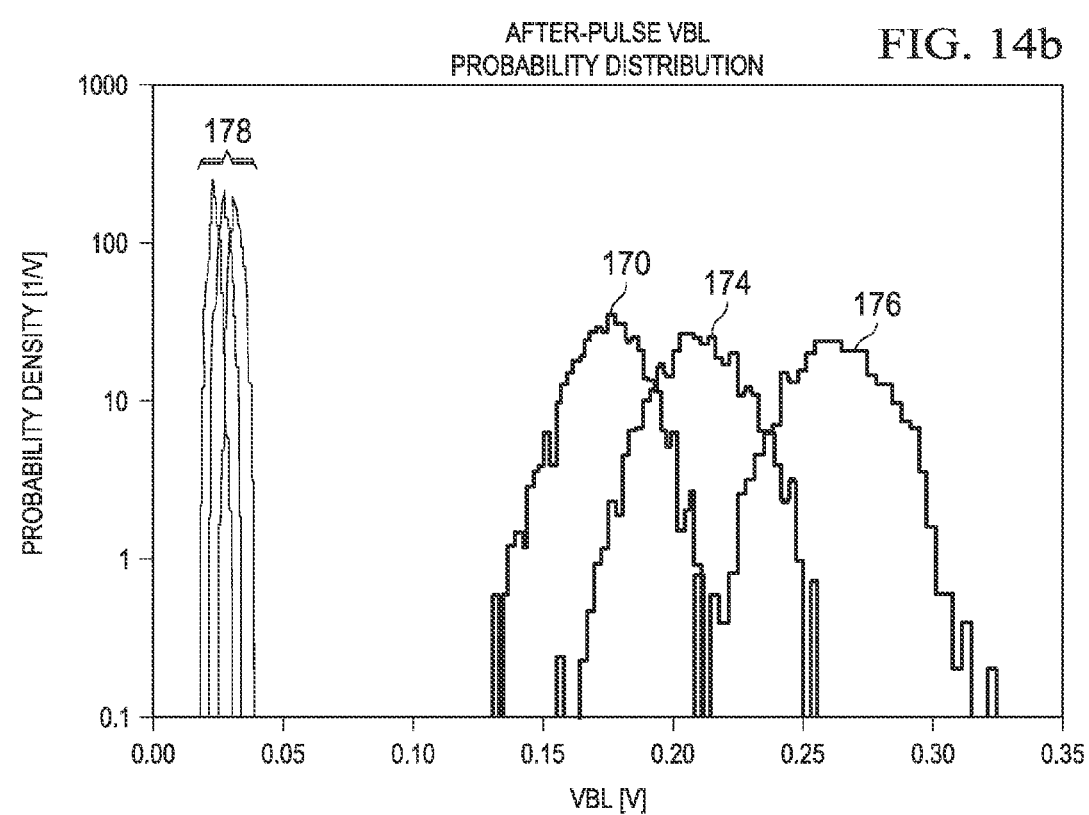

US 8,380,476 B2

MODELING OF FERROELECTRIC CAPACITORS TO INCLUDE LOCAL STATISTICAL VARIATIONS OF FERROELECTRIC PROPERTIES

CROSS-REFERENCE TO RELATED APPLICATIONS

This application claims priority, under 35 U.S.C. §119(e), of Provisional Application No. 61/180,286, filed May 21, 2009, incorporated herein by this reference.

This application is also related to commonly assigned U.S. application Ser. No. 12/394,849, filed Feb. 27, 2009, incorporated herein by this reference, which itself claims priority, under 35 U.S.C. §119(e), of Provisional Application No. 61/143,096, filed Jan. 7, 2009.

STATEMENT REGARDING FEDERALLY SPONSORED RESEARCH OR DEVELOPMENT

Not applicable.

BACKGROUND OF THE INVENTION

This invention is in the field of simulation of integrated circuits, and is more specifically directed to the simulation of integrated circuits including polarizable ferroelectric capacitors.

Non-volatile solid-state read/write memory devices are now commonplace in many electronic systems, particularly portable electronic devices and systems. A recently developed technology for realizing non-volatile solid-state memory devices is commonly referred to as "ferroelectric RAM", or "FeRAM", or "FRAM". According to this technology, memory cells are realized as capacitors in which the dielectric material is a polarizable ferroelectric material, such as lead zirconate titanate (PZT) or strontium-bismuth-tantalate (SBT). Hysteresis in the charge-vs.-voltage (Q-V) characteristic, based on the polarization state of the ferroelectric material, enables the non-volatile storage of information in the FRAM cell. In contrast, conventional dynamic random access memory (DRAM) memories are volatile, because DRAM memory cells use MOS capacitors that lose their stored charge on power-down of the device.

FIG. 1 illustrates an example of a Q-V characteristic of a conventional ferroelectric capacitor. As shown, the charge (Q) stored across the conductive plates depends on the voltage applied to the plates (V), and also on the recent history of that voltage. If the voltage V applied across the capacitor plates exceeds a "coercive" voltage $V_\alpha$, the capacitor is polarized into the "+1" state. According to this characteristic, once polarized to the "+1" state, so long as voltage V remains above coercive voltage $-V_\beta$, the capacitor will exhibit a stored charge of $+Q_1$. Conversely, if the voltage V applied across the capacitor plates is more negative than coercive voltage $V_\beta$, the capacitor is polarized into the "−1" state, and will exhibit a stored charge of $-Q_2$ for applied voltage V below $+V_\alpha$. Conventional FRAM devices commonly "read" the polarization state of the ferroelectric capacitor in each memory cell by causing a state change, and sensing whether current is output by the capacitor in response. For example, if the capacitor is already in a "+1" polarization state, no current will be output by applying a read voltage above coercive voltage $V_\alpha$; conversely, if the capacitor is in the "−1" polarization state, a current pulse will be produced as the capacitor changes state. This conventional read approach is thus a destructive process, requiring rewriting of the memory cell to replace the previous data state. Recent approaches have been developed that non-destructively read the polarization state of the device.

Simulation of the operation of electronic circuits is a staple task in the design of integrated circuits, even for the most simple of functions but especially as integrated circuit functionality and thus complexity has increased over time. Modern circuit simulation tools not only allow the circuit designer to ensure that the circuit carries out the intended function, but also enable the designer to evaluate the robustness of circuit operation over variations in temperature, signal levels, power supply voltages, and process parameters. A well-known circuit simulation program is the Simulation Program with Integrated Circuit Emphasis, commonly referred to as SPICE, originated at the Electronics Research Laboratory of the University of California, Berkeley. Many commercial versions of the SPICE program are now available in the industry, including several versions that are internal or proprietary to integrated circuit manufacturers.

According to SPICE-based circuit simulators, the circuit being simulated is expressed in terms of its elements such as resistors, transistors, capacitors, and the like. Each circuit element is associated with a model of its behavior (i.e., response to voltage or current stimuli), and is "connected" into the overall circuit simulation by specifying the circuit nodes to which it is connected. DC, AC, or transient analysis of the circuit is then performed by specifying any initial conditions (voltages, currents, stored charge etc.), as well as the variable or node of interest, for which the circuit response is to be analyzed. Higher level analysis of the circuit, for example noise analysis, transfer functions, and the like, can also be performed via such simulation.

The models used for semiconductor devices in the simulation can be relative simple circuit-based models, for example corresponding to the well-known Ebers-Moll or Gummel-Poon models. However, models based on device physics have now been derived that determine the device electrical characteristics according to physical parameters such as channel width, channel length, film or layer thicknesses, proximity to other devices, and the like. Such physical models can be correlated or combined with complex empirical electrical models derived from curve fitting to actual device electrical measurements, further improving (at least in theory) the precision with which the behavior of the circuit element can be simulated.

Typically, those device models that are defined largely by device physics parameters are especially useful in "analog" simulation of specific circuit functions, such as sense amplifiers. Other simulations, such as logic simulation of larger functions in the integrated circuit, typically do not require the precision of complex physical and empirical device models.

Examples of conventional models of ferroelectric capacitor behavior are described in Sheikholeslami et al., "A Survey of Behavioral Modeling of Ferroelectric Capacitors", Trans. Ultrasonics, Ferroelectrics, and Frequency Control, Vol. 44, No. 4 (IEEE, July 1997), pp. 917-24. Many of these conventional models are directed to models of the behavior of the "saturation" loop, which is generally considered as the switching component of the largest hysteresis loop of the ferroelectric capacitor. FIG. 1 shows such a saturation loop. As known in the art, the ferroelectric material between plates of the capacitor physically includes multiple polarization "domains", analogous to magnetic domains in ferromagnetic material. A domain is a homogenous region of a ferroelectric, in which all of the dipole moments in adjacent unit cells have the same orientation. The saturation loop is thus the Q-V hysteresis characteristic that describes the polarization of all of the ferroelectric domains within the capacitor in the same direction. As described in the Sheikholeslami et al. article, a hyperbolic tangent (tan h) function is a good approximation for the shape of the transition regions of the saturation loop.

By way of further background, the "distributed threshold switching model" described in the Sheikholeslami et al. article models ferroelectric capacitor polarization behavior over a large number of dipole domains. More specifically, this approach uses a Gaussian distribution of polarization over these domains, with the coercive voltage $V_c$ characterized by a mean value and standard deviation. From a circuit standpoint, this model treats the ferroelectric capacitance as five parallel circuit elements, including one resistor, one linear capacitor, and three non-linear capacitors. One of the non-linear capacitors represents the switching polarization of the ferroelectric capacitor, and is modeled by two Gaussian distributions of polarization versus voltage, representative of the multiple domains. One of the Gaussian distributions has a mean at the positive coercive voltage $+V_\alpha$ to the "+1" state, while the other has a mean at the negative coercive voltage $V_\beta$ to the "−1" state. The extent to which domains are polarized by a positive transition of a modeled applied voltage is defined by the Gaussian distribution of the positive coercive voltage $V_\alpha$.

By way of further background, Jiang et al., "Computationally Efficient Ferroelectric Capacitor Model for Circuit Simulation", *Digest of Technical Papers, Symposium on VLSI Technology*, Paper 10B-4 (IEEE, 1997), pp. 141-42, describes a multi-domain ferroelectric capacitor model that accounts for the history dependence of polarization for applied voltage levels below the coercive voltages. As known in the art, applied voltages below the coercive voltages tend to reduce the overall polarization of the capacitor. According to this model, the outer saturation loops are approximated by a tan h function of applied voltage, as in the Sheikholeslami et al. article. If lower magnitude voltages, between the coercive voltages, are then applied to the capacitor, some but not all of the domains will switch their polarization to the opposite state, and the overall Q-V characteristic changes accordingly. In short, the amount of charge stored by the remanent polarization in the device is reduced. According to the Jiang et al. approach, the history of these lower applied voltages applied to the capacitor is modeled by transformation of the tan h approximation of the outer saturation loops to define minor polarization loops lying within the outer saturation loop. More specifically, the Jiang et al. model identifies "turning points" in the Q-V characteristic over time, corresponding to changes in direction (i.e., changes in sign of dV/dt). The Q-V minor loop connecting two turning points is then defined by calculating a slope and intercept by way of which the outer saturation loop tan h function can fit the two turning points. As a result, the minor loops maintain the tan h shape, but fit the initial conditions at the turning points.

As known in the art, ferroelectric capacitors are vulnerable to various physical degradation mechanisms that appear as undesirable changes in the Q-V characteristics of the capacitors. While the electrical behavior of ferroelectric capacitors is complicated to model even without these degradation effects, as evident from conventional SPICE-related models such as described in the Sheikholeslami et al. and Jiang et al. articles, it is especially difficult to model that complex electrical behavior as it degrades over time and voltage history. The models described in the Sheikholeslami et al. and Jiang et al. articles in fact do not address time-dependent or stress-dependent effects.

By way of further background, Kuhn et al., "A New Physical Model for the Relaxation in Ferroelectrics", *Proceedings of the 30th European Solid-State Device Research Conference* (IEEE, 2000), pp. 164-67, describes the inclusion of relaxation effects into the Jiang et al. model. More specifically, the Kühn et al. article describes the calculation of artificial turning points that are a function of elapsed waiting time. These turning points are used to define additional minor loops in the Q-V characteristic, again by calculating a slope and intercept so that the tan h approximations of the outer saturation loops are fit to the artificial turning points and thus define the minor loops.

It has been observed, in connection with this invention, that the treatment of relaxation and imprint effects by conventional ferroelectric capacitor models are limited in their accuracy, relative to the stringent demands of modern integrated circuit design requirements. For example, while the Kuhn et al. article describes a model for relaxation effects, that approach is constrained to a model in which the minor loops necessarily have a tan h shape. No physical basis is presented to support the supposition that the minor loops will have such a shape after relaxation, much less correspond to changes in the saturation loop due to imprint.

Copending U.S. application Ser. No. 12/394,849, filed Feb. 27, 2009, incorporated hereinabove by reference and commonly assigned with this application, describes a new approach to the modeling of ferroelectric capacitors. According to that approach, the polarizable behavior of a ferroelectric capacitor is modeled by way of a multi-domain ferroelectric capacitor, in which each of the domains is associated with a positive and a negative coercive voltage. A probability distribution function of positive and negative coercive voltages is defined, from which a weighting function of the distribution of domains having those coercive voltages is defined. The electrical behavior of the ferroelectric capacitor is evaluated by evaluating the polarization of each of the domains, as weighted by the weighting function. A time-dependent factor can be included in the polarization expression evaluated for each domain, to include the effect of relaxation. The effects of longer-term mechanisms, such as imprint, can be modeled by deriving a probability distribution function for the domains after an accelerated stress.

In actuality, it has been observed that the electrical and polarization behavior of ferroelectric capacitors can vary significantly from capacitor to capacitor, including among capacitors within the same integrated circuit die. This local variability can even be exhibited between ferroelectric capacitors located next to one another within the same integrated circuit. For example, conventional FRAM memories can be constructed according to various arrangements, including a "1-T 1-C" (one transistor, one ferroelectric capacitor) arrangement that resembles a conventional dynamic RAM (DRAM) memory cell, a flip-flop arrangement similar to a conventional static RAM (SRAM memory cell, which includes four ferroelectric capacitors, and in a "2-T 2-C" (two transistor, two ferroelectric capacitor) FRAM cell, in which the stored data state is based on differential polarization between the two ferroelectric capacitors. In each case, the ferroelectric capacitors in each memory cell are typically very small in size, for maximum memory density per unit chip area. However, the local variability of ferroelectric capacitor behavior is especially noticeable in small capacitors, even between capacitors realized within the same memory cell.

FIG. 2 is a schematic diagram of a conventional 2-T 2-C FRAM memory cell $8_{j,k}$, as implemented within a conventional FRAM memory. It is of course to be understood that memory cell $8_{j,k}$ will be one cell in an array of FRAM memory cells 8; specifically, this memory cell $8_{j,k}$ resides in the $j^{th}$ row and the $k^{th}$ column of such an array. As known in the art, the size of the memory array can vary widely, from a few hundreds of kilobits to as many as several megabits. In the example of FIG. 2, memory cell $8_{j,k}$ includes two ferroelectric capacitors 10a, 10b, and two complementary metal-oxide-semiconductor (CMOS) pass gates 9a, 9b. A lower plate of each of ferroelectric capacitors 10a, 10b is connected to plate line PL, which is a common voltage applied to all memory cells 8 in the array. The upper plate of ferroelectric capacitor 10a is coupled to bit line $BL_k$ (for the $k^{th}$ column) via CMOS pass gate 9a, and the upper plate of ferroelectric capacitor 10b is coupled to bit line $\overline{BL}_k$ via CMOS pass gate 9b. Each of CMOS pass gates 9a, 9b is constructed as a p-channel MOS transistor and an n-channel MOS transistor with their source/drain paths connected in parallel between its associated ferroelectric capacitor 10a, 10b and its associated bit line $BL_k$, $\overline{BL}_k$, respectively. The gates of these complementary transistors within each of CMOS pass gates 9a, 9b are connected to word lines $WL_j$, $\overline{WL}_j$, which carry complementary word line voltages for the $j^{th}$ row in the memory array. Complementary bit lines $BL_k$, $\overline{BL}_k$ are coupled to inputs of sense/restore/write circuitry $14_k$, which drives data line $Dout_k$ with a logic level indicating the data state stored in a selected memory cell 8 in this $k^{th}$ column, in a read cycle. As known in the art, conventional read operations in FRAM memories are destructive reads, in that the sensed data state must be restored into the addressed memory cells 8 following the sense operation. During a write cycle, sense/write/restore circuitry $14_k$ will polarize ferroelectric capacitors 10a, 10b in its addressed memory cells 8 to complementary polarization states. As such, the ferroelectric capacitors 10a, 10b in each memory cell 8 within the array are polarized to opposite polarization states at all time; the polarity of the differential polarization indicates the stored data state in each memory cell 8.

While the 2-T 2-C arrangement of FRAM memory cells is useful in providing more robust storage than a 1-T 1-C cell, by virtue of the differential storage and sensing, it has been observed that local variability in the polarization behavior of the ferroelectric capacitors detrimentally affects memory performance. As known in the art, the polarization state of the 2-T 2-C ferroelectric memory cell is read by causing a polarization state change in each capacitor, and sensing the polarity of the differential signal output by the capacitor pair in response. For example, if a capacitor is already in a "+1" polarization state, no current will be output by applying a read voltage to that capacitor above its coercive voltage $V_\alpha$; conversely, if the capacitor is in the "−1" polarization state, a current pulse will be produced as the capacitor changes state. This differential current, or a voltage established by that current, is sensed by sense/write/restore circuitry $14_k$ to determine the stored data state. However, local variability of the polarization characteristic of ferroelectric capacitors 10a, 10b in a given memory cell $8_{j,k}$ can erode the differential signal produced in a read operation. For example, the coercive voltages $V_\alpha$, $V_\beta$ for ferroelectric capacitors 10a, 10b in the memory cell $8_{j,k}$ can vary relative to one another to such an extent that the differential signal does not reach the threshold reference level of sense/write/restore circuitry $14_k$ (especially in the presence of expected noise), thus causing a read failure.

Conventional modeling environments do not consider this local variability of polarization characteristics in ferroelectric devices. As such, the accuracy of simulations of modern FRAM devices or large-scale logic circuits including ferroelectric memory has been limited. This inaccuracy in simulation can lead, in the worst case, to errors in the operation of the designed integrated circuit. To avoid such errors, fabrication and electrical testing of actual ferroelectric devices is necessary to validate integrated circuit design. Typically, multiple design iterations and extensive costly testing is necessary to optimize the circuit design for actual device behavior. While the prudent designer, aware of the limitations of the FRAM model, can avoid circuit failure by designing sufficient operating margin into the circuit, such design overkill will not have optimum performance or efficiency, and can be unnecessarily costly in integrated circuit chip area.

BRIEF SUMMARY OF THE INVENTION

This invention provides a method of modeling ferroelectric capacitors, a method of simulating circuits including such modeled ferroelectric capacitors, and computer-readable media encoded with a computer program that, when executed, causes a computer to carry out such methods, in which local variability among ferroelectric capacitors within the same circuit can be accurately modeled and the resulting circuit behavior simulated.

This invention also provides such a method and media in which the robustness of integrated circuit operation can be improved and verified by way of such modeling and simulation.

This invention also provides such a method and media in which the modeled local variability of ferroelectric capacitors can be accurately calibrated by reference to electrical measurements of physical ferroelectric devices.

Other advantages of this invention will be apparent to those of ordinary skill in the art having reference to the following specification together with its drawings.

The present invention may be implemented into a computerized system and method of operating such a system in which local variability of ferroelectric devices, such as capacitors, is included in models for those devices in circuits to be simulated. Probability density functions for the polarization characteristics of ferroelectric domains are derived based on measurement or characterization of actual devices. To build a model of a small ferroelectric device, a number of domains is determined from a domain density and the area of the small device. Probability distributions for each gridcell in a grid of coercive voltage ranges are derived, based on the probability density function of the material as a whole. Random sampling of those gridcell probability distributions determines the polarization characteristics of the relatively few domains for the small ferroelectric device. Statistical or functional analysis of the effects of local variability on the overall circuit can then be performed, for example over a population of sample iterations or relative to selected characteristics.

BRIEF DESCRIPTION OF THE SEVERAL VIEWS OF THE DRAWING

FIG. 3 is a schematic diagram illustrating a model of a ferroelectric capacitor according to embodiments of the invention.

FIG. 14b is a plot of bit line voltage probability distributions for a ferroelectric memory simulated according to the process shown in FIG. 14a according to an embodiment of this invention.

DETAILED DESCRIPTION OF THE INVENTION

The present invention will be described in connection with particular embodiments, namely as implemented into the modeling of ferroelectric capacitors for use in a simulation program such as the Simulation Program with Integrated Circuit Emphasis (SPICE), because it is contemplated that this invention will be especially beneficial when used in such a context. However, it is contemplated that this invention may be used to model other ferroelectric elements and other complex circuit elements, and in connection with other simulation environments. Accordingly, it is to be understood that the following description is provided by way of example only, and is not intended to limit the true scope of this invention as claimed.

Figure 2:
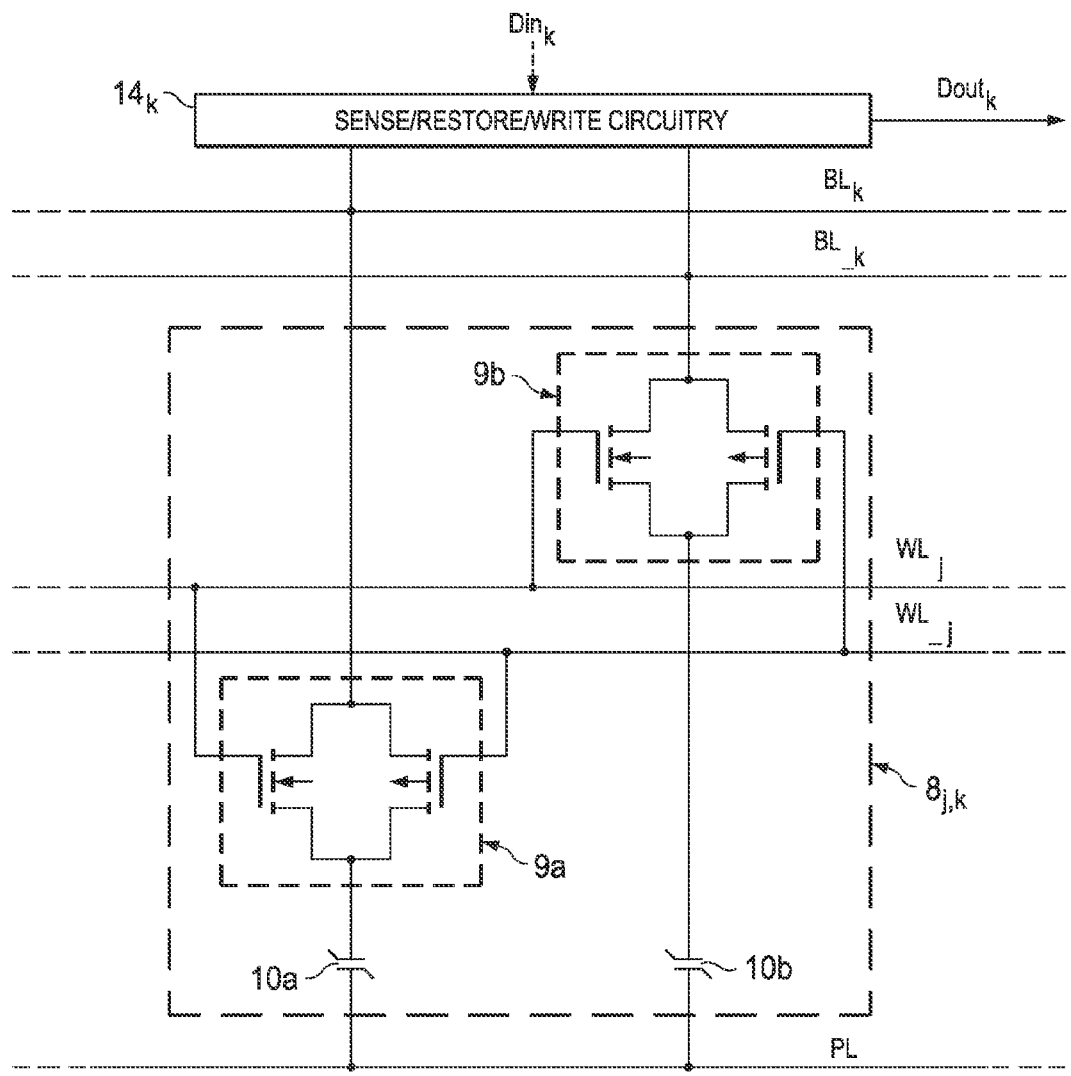
FIG. 2 is an electrical diagram, in schematic form, of a conventional ferroelectric memory cell.

As described above, FIG. 2 illustrates an example of ferroelectric random access memory (FRAM) cell $8_{j,k}$, within which ferroelectric capacitors 10a, 10b are implemented in a 2-T 2-C arrangement. Embodiments of this invention are directed to modeling of ferroelectric capacitors 10a, 10b in a form suitable for simulation of large-scale circuits, such as an FRAM memory including an array of memory cells 8. Alternatively, models of one or more ferroelectric capacitors according to embodiments of this invention may be used in the simulation of other circuits, including the simulation of analog circuits in which the response of one or more of such ferroelectric capacitors to specified stimuli is analyzed. However, for purposes of this description, reference will be made to an FRAM memory including an array of memory cells such as memory cell $8_{j,k}$ of FIG. 2, to provide an illustrative example of the operation of embodiments of this invention.

As known in the art and as described in copending and commonly assigned application Ser. No. 12/394,849, incorporated herein by reference, conventional ferroelectric capacitors are physically realized in integrated circuit devices by elements of conductive material, such as patterned portions of a metal (e.g., aluminum, tungsten, alloys, etc.) or doped polysilicon film, with or without cladding, that serve as the upper and lower plates of the ferroelectric capacitor. A film of ferroelectric material, such as such as lead zirconate titanate (PZT) or strontium-bismuth-tantalate (SBT), among others, is deposited or otherwise formed after the formation of the lower conductive plate and before the formation of the upper conductive plate; photolithographic patterning of this material, along with the plates themselves (either in the same operation or in separate etch operations) defines each ferroelectric capacitor in the integrated circuit. Conductive connections to the upper and lower plates of the ferroelectric capacitors are made in the conventional manner, according to the particular technology used to fabricate the integrated circuit containing the ferroelectric capacitors, and according to the desired layout of that integrated circuit. It is contemplated that those skilled in the art having reference to this specification comprehend the materials and manufacturing processes appropriate for physical realization of ferroelectric capacitors in a particular integrated circuit.

Theory of the Model

According to this embodiment of the invention, ferroelectric capacitors are modeled by way of multiple components, each representative of a particular electrical response. In general, the behavior of ferroelectric capacitors can be represented by way of a non-ferroelectric capacitor in parallel with a ferroelectric capacitor. In other words, the capacitance of a ferroelectric capacitor includes a component that does not vary with polarization state, along with a component that does so vary. In the example of the modeling representation of ferroelectric capacitor 10 of FIG. 3 (corresponding to one of ferroelectric capacitors 10a, 10b in memory cell $8_{j,k}$ of FIG. 2), this behavior is represented by non-ferroelectric capacitor 12 and multi-domain ferroelectric capacitor 14, connected in parallel with one another between voltage +VA and ground.

According to this embodiment of the invention, the non-ferroelectric component of ferroelectric capacitor 10 is modeled by capacitor 12 with a non-linear charge-voltage (Q-V) characteristic.

$$Q = C_{min}V + Q_{nfe}\tanh\left(\frac{V - V_0}{V_{sc}}\right)$$

where the parameters $C_{min}$, $Q_{nfe}$, $V_{sc}$, and $V_0$ are determined by experiment and characterization. As evident from this expression, this non-ferroelectric capacitance component is non-linear with voltage, as expressed by the tan h component of the sum, but is independent of polarization state.

Other electrical behavior components that are not dependent on the polarization state can be included in the model of ferroelectric capacitor 10. For example, a more rigorous model of ferroelectric capacitor 10 can include a parallel linear resistor for modeling leakage through ferroelectric capacitor 10, and a parallel linear capacitor for simulating the linear part of electronic and non-switching ionic polarization.

The switching capacitance resulting from the ferroelectric polarization of ferroelectric capacitor 10 is modeled by multi-domain ferroelectric capacitor 14, according to this embodiment of the invention. As shown in FIG. 3, multi-domain ferroelectric capacitor 14 is considered as n individually and independently polarizable domains $15_0$ through $15_{n-1}$, each of which has a polarization characteristic as if it constituted a ferroelectric capacitor in and of itself. Because of this independence, domains $15_0$ through $15_{n-1}$ can have different polarization states from one another, depending on their respective coercive voltages and on the history of voltages applied to ferroelectric capacitor 10, among other factors. As will be described in this specification, the switching capacitance component of ferroelectric capacitor 10 is modeled as the superposition of these domains $15_0$ through $15_{n-1}$, more specifically as the summation of the polarization of those domains 15. According to embodiments of this invention, the number n of domains 15 will depend on the size of ferroelectric capacitor 10 that is being modeled. By way of example, it is contemplated that the number n may vary from as few as thirty domains 15, to as many as on the order of 100 or more.

The Polarization Characteristic

Figure 1:
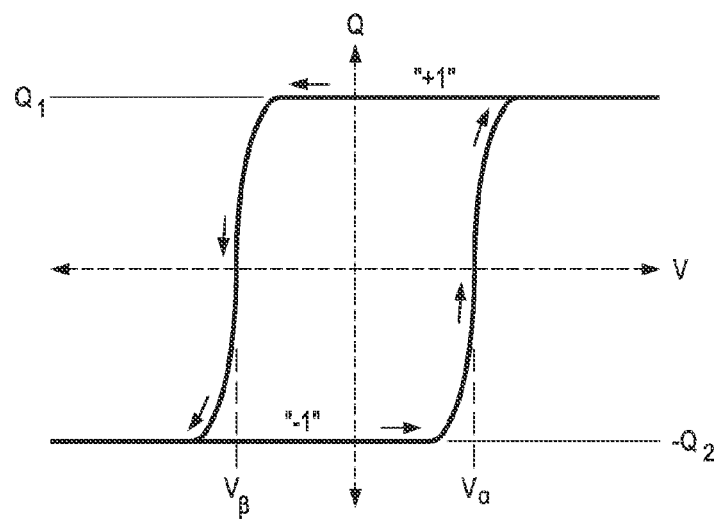
FIG. 1 is a charge-vs.-voltage characteristic of a conventional ferroelectric capacitor.
Figure 4:
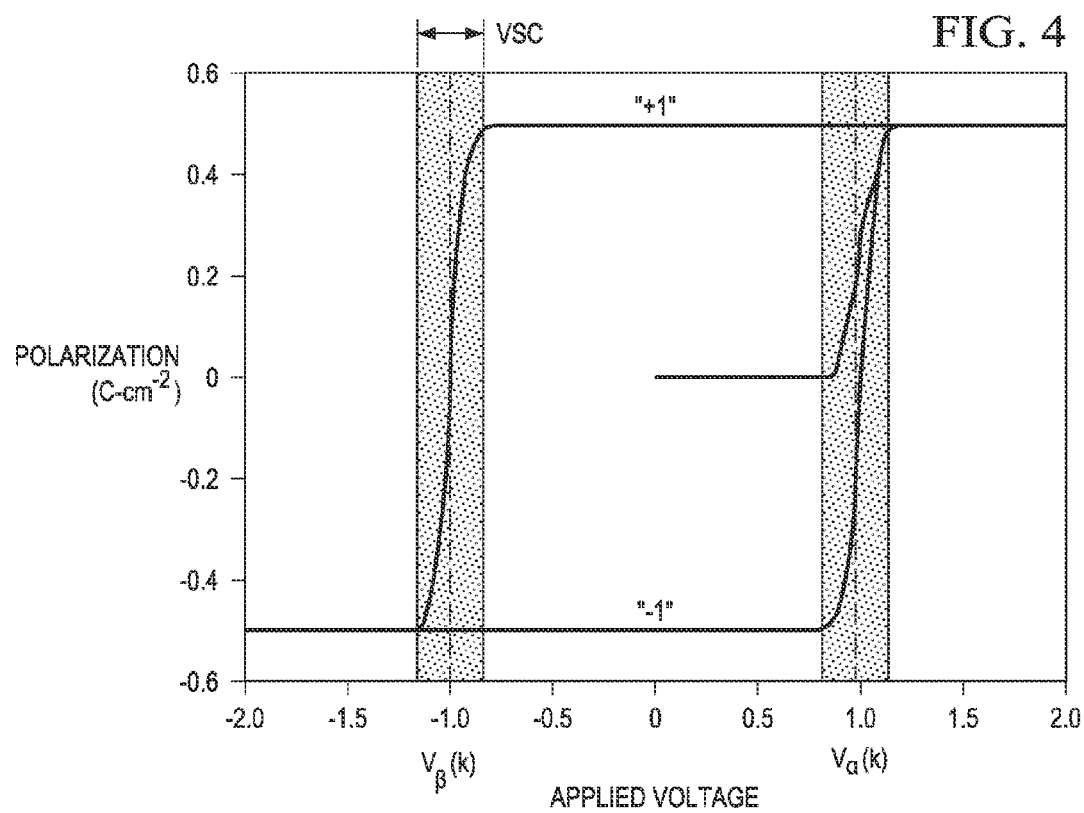
FIG. 4 is a model charge-vs.-voltage characteristic for an individual domain within a multi-domain model of a ferroelectric capacitor, as used in embodiments of the invention.

The polarization characteristic of each of domains $15_0$ through $15_{n-1}$ is expressed as a non-linear function of applied voltage and of polarization state, according to embodiments of the invention. In one embodiment of the invention, this non-linear Q-V characteristic function is expressed as the piece-wise combination of a hyperbolic tangent (tan h) function with a quadratic function. More specifically, the Q-V characteristic function for one of domains $15_0$ through $15_{n-1}$ is given by a pair of such piece-wise combinations of functions over voltage, with the applicable pair depending on the polarization state of the domain. FIG. 4 illustrates an example of the polarization characteristic of a single domain $15_k$ in the representation of multi-domain ferroelectric capacitor 14 of FIG. 3. In the each of the "−1" and "+1" polarization states, the "flat" portion of the curve plus the portion of the curve extending from that flat portion to the coercive voltage is represented by a tan h function, and the portion of the curve beginning at the transition point (i.e., at the coercive voltage) and extending to the opposite polarization state is represented by a quadratic function (parabola). FIG. 4 also illustrates an initial polarization portion of the polarization function, extending from an origin point (Q=0, V=0) as the modeled capacitor is first polarized into the "+1" state.

For the example of domain $15_k$ represented by the polarization characteristic of FIG. 4, the Q-V characteristic for the "−1" polarization state can be expressed in terms of the coercive voltage $V_\alpha(k)$ of domain $15_k$ as:

$$Q_k = \theta_{-1}(k)\tanh\left(2\frac{V - V_\alpha(k)}{V_{sc}}\right), \text{ for } V < V_\alpha(k)$$

and $$Q_k = \theta_{-1}(k)\left[1 - \frac{(V - V_\alpha(k) - V_{sc})^2}{V_{sc}^2}\right], \text{ for } V \geq V_\alpha(k)$$

where $V_{sc}$ represents the width of the transition voltage band VSC in FIG. 4, and where $\theta_{-1}(k)$ represents the dipole moment of a single domain (i.e., corresponds to the polarization contribution of a single domain), taking a non-zero value for a polarization state of "−1" and a zero value in the "+1" polarization state. Conversely, the Q-V characteristic of domain $15_k$ for the "+1" polarization state can be expressed in terms of its coercive voltage $V_\beta(k)$ as:

$$Q_k = \theta_{+1}(k)\tanh\left(2\frac{V - V_\beta(k)}{V_{sc}}\right), \text{ for } V > V_\beta(k)$$

and $$Q_k = \theta_{+1}(k)\left[1 - \frac{(V - V_\beta(k) - V_{sc})^2}{V_{sc}^2}\right], \text{ for } V \leq V_\beta(k)$$

where single-domain dipole moment value $\theta_{+1}(k)$ is non-zero for a polarization state of "+1" (and a zero value in the "−1" polarization state). The single-domain dipole moment values $\sigma_{-1}(k)$ and $\theta_{+1}(k)$ according to embodiments of this invention, reflect random domain fluctuations in small ferroelectric elements, as will be described in detail below. These expressions for the Q-V characteristic of domain $15_k$ essentially mimic the ideal Preisach behavior of ferroelectric capacitors, as known in the art. These expressions provide the precision of finite slope transition regions, and also ensure that the capacitance value varies smoothly across polarization state transitions.

Other expressions of the outer saturation loops of the polarization characteristic can alternatively be used in connection with the model of multi-domain ferroelectric capacitor 14, according to this invention. In any case, however, the multiplicative factors $\theta_{-1}(k)$ and $\theta_{+1}(k)$ derived according to this invention should be included in the Q-V expression. It is contemplated that the selection of the appropriate outer saturation loop polarization function is best determined by electrical characterization of fabricated ferroelectric capacitors, in the conventional manner.

The individual domains $15_0$ through $15_{n-1}$ that together represent multi-domain ferroelectric capacitor 14 have coercive voltages $V_\alpha, V_\beta$ that vary from one another, according to embodiments of this invention. As mentioned above, the number n of domains 15 within a model ferroelectric capacitor 14 depends on the size of ferroelectric capacitor 10 being modeled, and can vary from as low as about thirty domains to a relatively large number of domains, for example on the order of hundreds. In a specific embodiment of this invention, the number of model domains 15 is approximately the number of physical ferroelectric domains that are in fact present in an actual ferroelectric capacitor of the same size.

Figure 5:
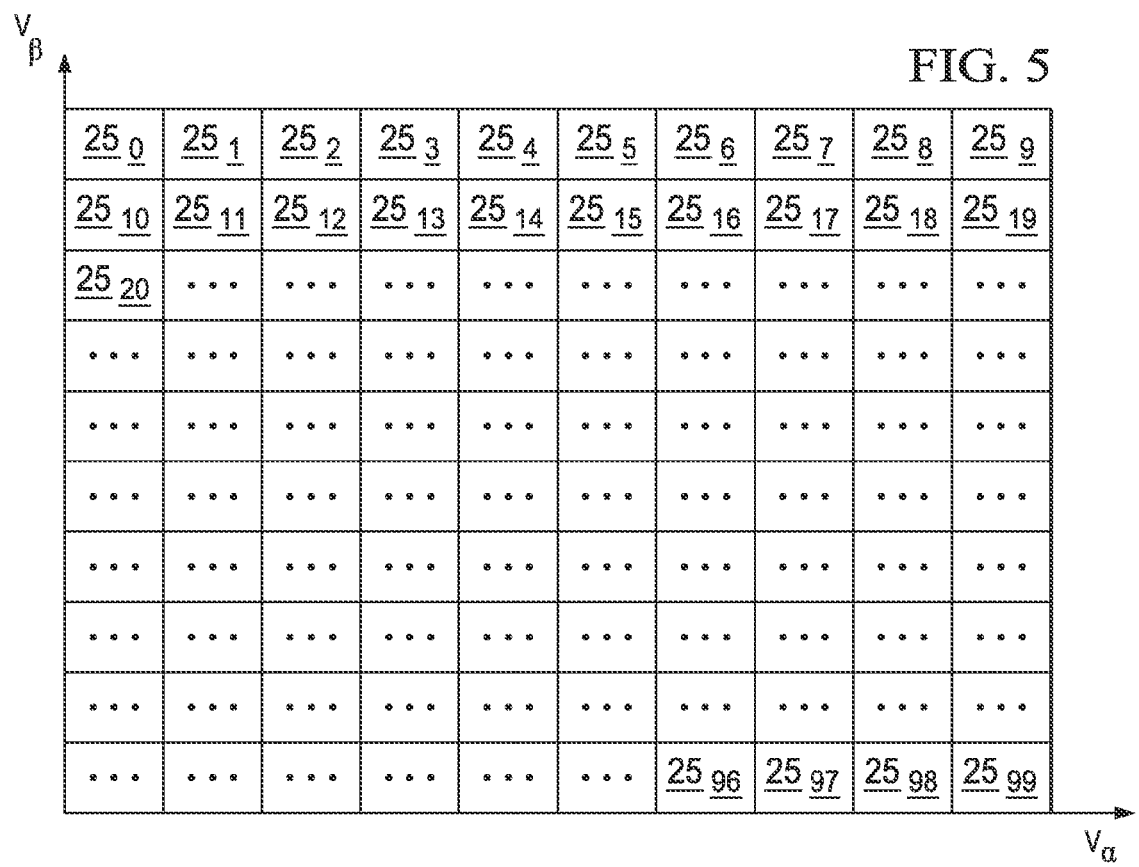
FIG. 5 is a plot illustrating gridcells having varying positive and negative coercive voltages, into which domains of the multi-domain model of a ferroelectric capacitor are assigned, as used in embodiments of the invention.

The range over which coercive voltage levels $V_\alpha(k)$ and $V_\beta(k)$ may vary can be determined by experiment or from experience. According to embodiments of this invention, the full voltage range is represented by a grid of coercive voltage levels $V_\alpha(k)$ and $V_\beta(k)$. An example of such a grid is illustrated in FIG. 5, by way of one hundred gridcells $25_0$ through $25_{99}$ covering an arbitrary expected coercive voltage range. In practice, the desired granularity of the model (and thus the precision with which the model can theoretically correspond to actual measurement) will determine the number m of gridcells 25, as well as the extent of the expected range of coercive voltages $V_\alpha(k)$ and $V_\beta(k)$. For example, it is contemplated that thousands of gridcells 25 (e.g., 2500 or more) will typically be used.

For the modeling of relatively small capacitors, the number n of domains $15_0$ through $15_{n-1}$ will be much smaller than the number m of gridcells 25 representing the possible combinations of coercive voltages. As will become evident from this specification, this shortfall is used to reflect the local variability of actual ferroelectric capacitors in an integrated circuit, by providing individual model ferroelectric capacitors 10 with different behavioral characteristics. On the other hand, a large ferroelectric capacitor 10 may have a sufficiently large number of actual domains that those n domains $15_0$ through $15_{n-1}$ cover the full range of expected coercive voltages $V_\alpha$ and $V_\beta$. Alternatively, regardless of the size of the actual ferroelectric capacitor as constructed, one may model an average ferroelectric capacitor 10 (i.e., having average characteristics as taken over a large sample size) by assigning a large number n of domains 15 to that model (n>m), without regard to whether an actual ferroelectric capacitor would have that number n of polarizable domains 15.

In either case, according to embodiments of the invention, the Q-V characteristic of multi-domain ferroelectric capacitor 14 is modeled by the superposition of the Q-V characteristics of its n domains 15, as determined by the gridcells 25 of the coercive voltage grid shown in FIG. 5 corresponding to those n domains 15. For large capacitors where n>m, and as described in copending U.S. application Ser. No. 12/394,849, the distribution of domains 15 within the various gridcells 25 is weighted by the likelihood that a specific domain $15_k$ having coercive voltage levels $V_\alpha(k)$ and $V_\beta(k)$ is present within the capacitor being modeled. More specifically, the Q-V characteristic of multi-domain ferroelectric capacitor 14 can be expressed as:

$$Q = \sum_{j=0}^{m-1} Q_j(V, X_k) W_j(V_\alpha(j), V_\beta(j))$$

where $W_j(V_\alpha(j), V_\beta(j))$ is a weighting function corresponding to the number of domains 15 in the modeled ferroelectric capacitor 10 that have coercive voltage levels $V_\alpha(j)$ and $V_\beta(j)$ corresponding to a given one of m gridcells $25_j$, based on the probability density functions. The function $Q_j$ represents the Q-V characteristic for a single domain $15_k$ that has coercive voltage levels $V_\alpha(j)$ and $V_\beta(j)$ corresponding to gridcell $25j$, where the $X_k$ variable represents the current polarization state of that domain $15_k$ (and thus selects the correct Q-V equation). According to this embodiment of the invention, if more than one domain 15 belongs to a given gridcell $25_j$, those domains 15 are and will remain in the same polarization state as one another throughout device operation.

Figure 6A:
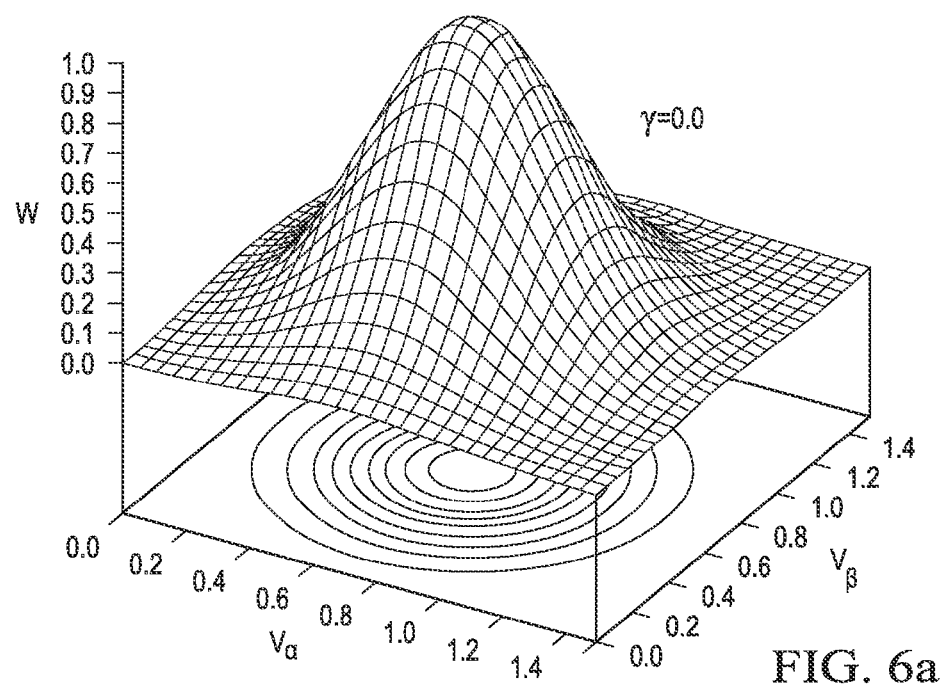
FIGS. 6a and 6b are plots illustrating probability distribution functions of coercive voltages over multiple domains in a modeled ferroelectric capacitor, according to embodiments of the invention.
Figure 6B:
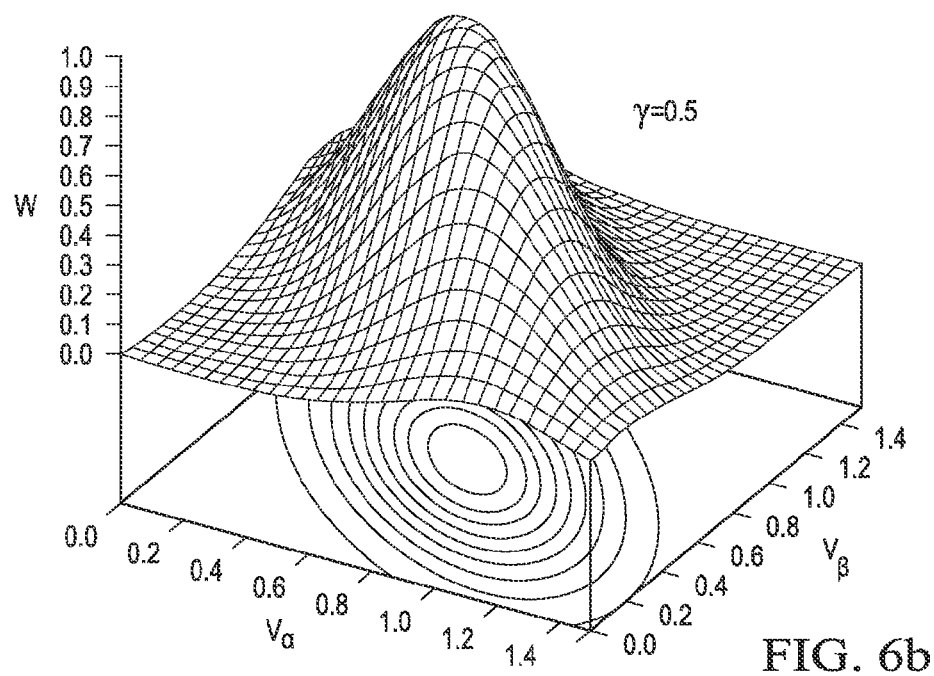

The probability distribution represented by weighting function $W_j$ incorporates the actual physical properties of the ferroelectric capacitor 10 into the polarization determination, for the case of a large ferroelectric capacitor 10 (m>n), or assuming an average ferroelectric capacitor 10. FIGS. 6a and 6b illustrate examples of probability distribution function W. In general, the shape and attributes of the probability distribution function W can be determined based on electrical measurement and characterization of the response of actual ferroelectric capacitors. It has been observed, in connection with the invention, that a correlated bi-variate Pearson IV distribution is a good approximation of the probability distribution function W for typical ferroelectric capacitors, where the degree of correlation between coercive voltage levels $V_\alpha$ and $V_\beta$ generally being the determining characteristic of the shape of the function W. According to this type of distribution, one can express the probability distribution function $W_k$ for a given domain $15_k$, with coercive voltage levels $V_\alpha(k)$ and $V_\beta(k)$, as:

$$W_k(V_a(k), V_b(k)) = N \exp\left[ -\left(\frac{V_\alpha(k) - V_{\alpha 0}}{\sigma_\alpha}\right)^2 - 2\frac{\gamma(V_\alpha(k) - V_{\alpha 0})(V_\beta(k) - V_{b0})}{\sigma_\alpha \sigma_\beta} - \left(\frac{V_\beta(k) - V_{\beta 0}}{\sigma_\beta}\right)^2 \right]$$

where γ is the correlation coefficient of coercive voltages $V_\alpha$ and $V_\beta$, where $V_{\alpha 0}$ and $V_{\beta 0}$ are calibration voltages placing the distribution at the desired place in the $V_\alpha$-$V_\beta$ plane, and where $\sigma_\alpha$ and $\sigma_\beta$ are the standard deviations of the distribution of coercive voltages $V_\alpha$ and $V_\beta$, respectively. FIG. 6a illustrates probability distribution function $W_k$ in the case in which correlation coefficient γ is zero, and FIG. 6b illustrates probability function $W_k$ in the case in which correlation coefficient γ=0.5.

Of course, other probability distribution shapes may alternatively be used to express weighting function W. It is contemplated that the probability distribution function will generally be dependent on the attributes of the ferroelectric material used to realize ferroelectric capacitor 10, and it is also contemplated that a wide range of possibilities for the shape of these distributions will be encountered. Electrical characterization of the best probability distribution function for a particular ferroelectric material and the process conditions for that material is contemplated to be the preferred approach for defining weighting function W, according to this invention.

Minor Loops

As described above, the overall Q-V characteristic of multi-domain ferroelectric capacitor 14 is specified by the superposition of individually polarizable domains with distinct coercive voltages. The evaluation of the polarization charge on that capacitor 14 is a function of the applied voltage V, and is also a function of the polarization state $X_k$ of each of the domains $15_k$ in the representation (as weighted by the probability distribution function). Because the polarization state $X_k$ of each domain $15_k$ is an input into the Q-V characteristic, the voltage history of capacitor 14 is necessarily incorporated into the modeled Q-V characteristic, in a manner that is not constrained to a particular minor loop shape as in conventional models.

Figure 7:
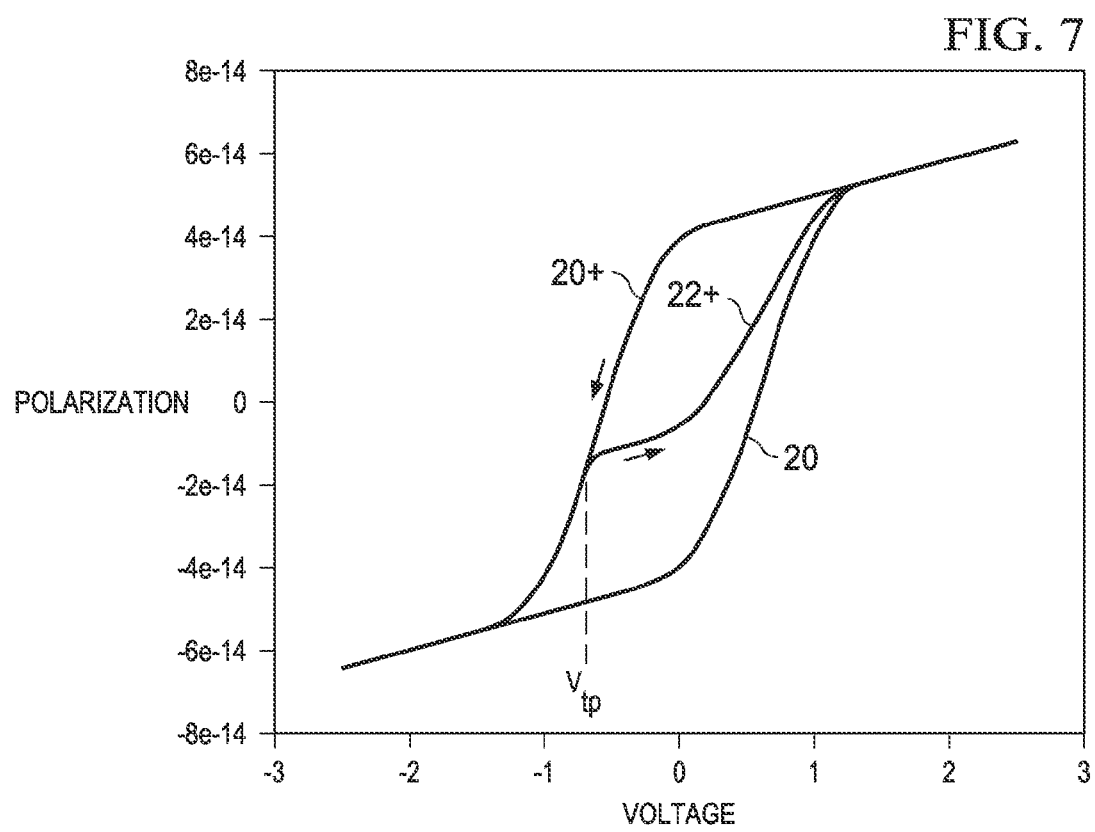
FIG. 7 is a plot illustrating the polarization characteristic of a modeled ferroelectric capacitor, including a minor loop in that characteristic, according to embodiments of the invention.

FIG. 7 illustrates the modeled Q-V characteristic for a multi-domain ferroelectric capacitor 14 according to this embodiment of the invention (in the form of a polarization-vs.-voltage plot; as known in the art, polarization of a ferroelectric capacitor is expressed as charge per unit area). Curves 20+, 20− represent the outer saturation loop of the overall Q-V characteristic of this example of multi-domain ferroelectric capacitor 14, in which the charge Q is based on the sum of contributions from a set of domains 15 that are distributed according to a probability distribution function such as shown in FIGS. 6a and 6b. The outer saturation loop represented by curves 20+, 20− in FIG. 7 constitute the Q-V characteristic for the case in which the applied voltage V exceeds the coercive voltages $V_\alpha$ and $V_\beta$ for all of the domains 15 in the model. As such, curve 20+ illustrates the Q-V characteristic after the application of a voltage sufficiently high to place all domains 15 in the "+1" polarization state, and curve 20− illustrates the Q-V characteristic after the application of a voltage sufficiently negative to place all domains 15 in the "−1" polarization state.

In the case illustrated in FIG. 7, however, a negative-going swing in the applied voltage V falls short of the voltage necessary to saturate the polarization of capacitor 14 into the "−1" state. In this example, the applied voltage is reduced from the "+1" saturation voltage (i.e., about +1.3 volts) to a negative voltage $V_{tp}$ that is less negative than the "−1" saturation voltage; the applied voltage V, then increases back to the "+1" saturation voltage. In this case, not all of domains 15 are placed into the "−1" polarization state by this negative-going swing. Typically, this lower voltage negative swing, when followed by a positive voltage swing, results in a minor loop (or "inner loop") of the polarization curve.

This model of multi-domain ferroelectric capacitor 14 described in copending application Ser. No. 12/394,849 and as useful in connection with embodiments of this invention fully accounts for the effects of this lower voltage excursion. As described therein, the modeled minor loops are not constrained to the tan h/quadratic representation of outer saturation loops 20+, 20−. Rather, the extent to which domains 15 within the multi-domain ferroelectric capacitor 14 have their polarization states changed by the application of a voltage between the saturation voltages is determined solely by the probability distribution function incorporated into weighting function W. As a result, because the minor loops in the polarization-vs.-voltage behavior of ferroelectric capacitor 10 can be independently derived (relative to the shape of the outer loops), the resulting model of ferroelectric capacitor 10 is substantially more accurate than conventional mathematic models described above.

Relaxation Effects

The multi-domain ferroelectric capacitor 14 model described in copending U.S. application Ser. No. 12/394,849 and as useful in connection with embodiments of this invention is also capable of accurately incorporating loss of polarization caused by relaxation, as will now be described. As known in the art, relaxation of a ferroelectric capacitor refers to the reduction in remanent polarization that occurs after the passage of time in the absence of an applied voltage, which occurs as the polarized domains tend toward thermal equilibrium. Relaxation effects are distinguishable from imprint, because the lost polarization due to relaxation can be restored by re-application of a coercive voltage, which re-establishes the full polarization level. The effects of imprint, on the other hand, permanently affect the ability of the domains to polarize, regardless of the applied voltage level. As such, relaxation in a ferroelectric capacitor is analogous to the loss of data in a DRAM cell in the absence of a "refresh" operation.

As described in copending U.S. application Ser. No. 12/394,849, incorporated herein by reference, relaxation effects are included in the polarization summation by way of a multiplicative factor that is a time-dependent function. This time-dependent relaxation function r(t) is included in the Q-V calculation of the "flat" portion (e.g., the tan h function) of the characteristic for each individual domain 15$_k$, for each of the "+1" and "−1" polarization states:

$$Q_k = \theta_{-1}(k) \cdot r(t) \cdot \tanh\left(2\frac{V - V_\alpha(k)}{V_{sc}}\right), \text{ for } V < V_\alpha(k)$$

for the "−1" state, and $$Q_k = \theta_{+1}(k) \cdot r(t) \cdot \tanh\left(2\frac{V - V_\beta(k)}{V_{sc}}\right), \text{ for } V > V_b(k)$$

for the "+1" state.

It has been observed that a reasonable expression for relaxation function r(t) is based on an exponential function of time t from full polarization down to an asymptotic value, for example to a final minimum polarization of about 0.70 of the original value (i.e., to a maximum polarization loss due to relaxation of about 30%). According to one example of this embodiment of the invention, relaxation effects are incorporated into the model by considering the fraction of domains 15 within each gridcell 25 of the coercive voltage grid (FIG. 5) that lose their polarization over time, due to relaxation.

As described in described in copending U.S. application Ser. No. 12/394,849, incorporated herein by reference, relaxation function r(t) can be expressed as:

$$r(t) = \frac{n_i(t)}{n_{io}}$$

where $n_{io}$ is the number of domains 15 associated with gridcell 25$_i$ that are polarized to a given state prior to any relaxation interval, and where $n_{min}$ as the minimum number of domains 15 that retain that polarization state after some arbitrarily long relaxation interval (i.e., the asymptotic number of domains remaining polarized within gridcell 25$_i$). The number $n_i(t)$ of domains remaining polarized after relaxation time t is given by:

$$n_i(t) = n_{min} + (n_{io} - n_{min})e^{-w_i t}$$

where the exponential term $w_i$ is a relaxation time constant that is constructed to reflect the dependence of relaxation on coercive voltage:

$$w_i = \lambda e^{-V_i^2/V_{sc}^2}$$

where λ is a curve-fitting constant, and where $V_i$ is the applicable coercive voltage $V_\alpha$ and $V_\beta$ for gridcell 25$_i$, depending on the current polarization state of domains 15 associated with that gridcell 25$_i$ ($V_i = V_\alpha$ for domains in the "+1" state, and $V_i = V_\beta$ for domains in the "−1" state). It is contemplated that these parameters for exponential loss of polarization due to relaxation may be determined by electrical characterization of actual ferroelectric capacitors. As described above and in copending U.S. application Ser. No. 12/394,849, the relaxation effect is thus included in the polarization summation over all gridcells 25. Evaluation of the polarization of multi-domain ferroelectric capacitor 14 after time t of no applied voltage can then be performed by way of the weighed (W) sum described above.

Alternatively, it is contemplated that other simpler, or even more complex, expressions for relaxation function r(t) may be derived based on electrical characterization of actual ferroelectric capacitors. It is contemplated that this, and other, physical relationships of relaxation to capacitor and electrical parameters can be incorporated into the relaxation function r(t) by those skilled in the art having reference to this specification.

In any case, the time variable t is contemplated to correspond to the elapsed time of the absence of an applied voltage to ferroelectric capacitor 10. Upon application of a voltage across ferroelectric capacitor 10, additional loss of polarization due to relaxation ceases, but the effect of relaxation on the polarization of the various domains 15 remains until the polarization state of the domains is again written by the application of a coercive voltage.

Figure 8:
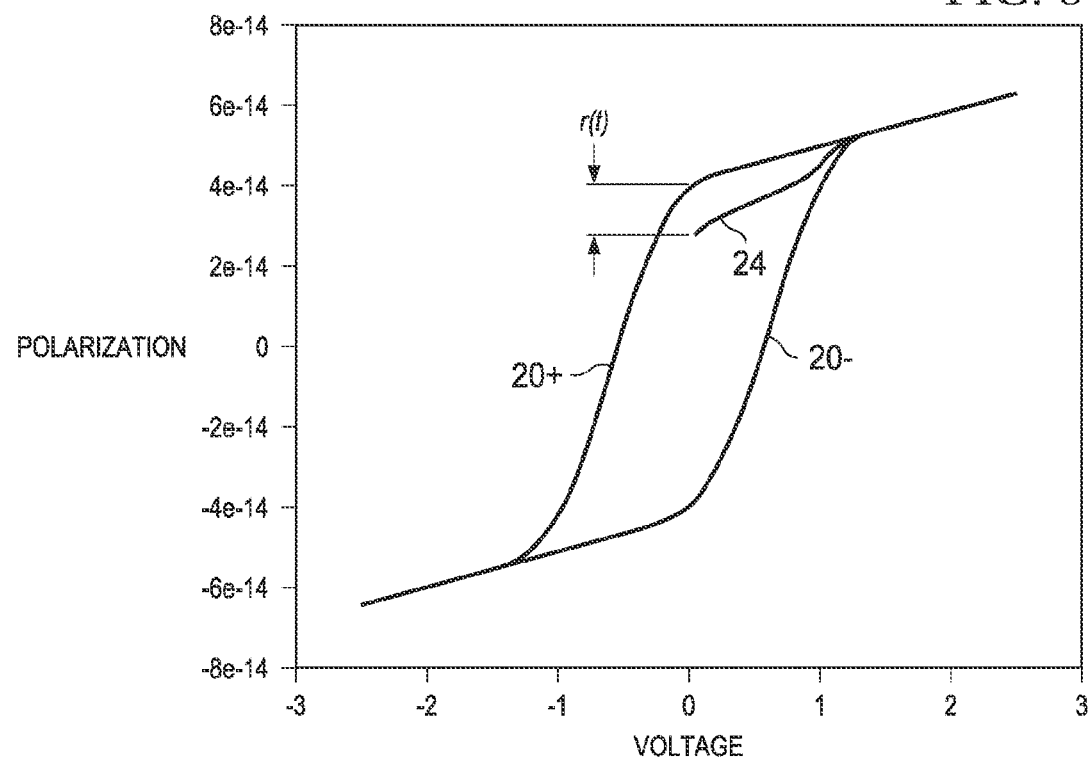
FIG. 8 is a plot illustrating the effects of relaxation in the polarization characteristic of a modeled ferroelectric capacitor, according to embodiments of the invention.

FIG. 8 illustrates the relaxation mechanism modeled according to this embodiment of the invention, for the case of loss of polarization due to relaxation from the "−1" state. In the example shown in FIG. 8, the polarization function r(t) represents a loss of polarization of each of the n domains in ferroelectric capacitor 14 from the "−1" polarization state of outer saturation loop 20, for example following the exponential time-dependence described above. The resulting polarization charge from evaluation of the polarization summation, at a particular applied voltage, will lie on polarization curve 24 as shown in FIG. 8 in this example.

Imprint

As described in copending U.S. application Ser. No. 12/394,849, imprint effects can also be modeled in connection with the polarization curves. The same calculations are performed as described above, but the weighting function W is different when modeling the behavior of ferroelectric capacitor 10 in later life. In modeling ferroelectric capacitor 10 in this case, one of a set of available weighting functions W is selected to match the stage in the life of ferroelectric capacitor for which the circuit simulation is to be carried out. As such, the behavior of a circuit including ferroelectric capacitor 10 can be simulated to determine its operability and robustness toward the end-of-life of ferroelectric capacitor 10.

Local Variability

As known in the art, the polarization properties of ferroelectric capacitors can vary from wafer to wafer, or from lot to lot, because of variations in the manufacturing process. These global effects have been observed to be due to variations in the material properties of the ferroelectric material itself (e.g., PZT) as deposited and processed, due to variations in the thickness of the ferroelectric material in the fabricated integrated circuit, due to variations in feature length of the ferroelectric devices as patterned and etched, and the like.

It has been observed, in connection with this invention, that significant local variability in polarization properties is also present in modern ferroelectric devices. This type of variability is local, in the sense that the polarization properties vary from structure to structure within the same integrated circuit die, even to the extent of varying between the two capacitors within the same 2-T 2-C memory cell 8 described above relative to FIG. 2. While local variability can be due to local variations in feature geometry (capacitor plate length and width, for example), it has been discovered, according to this invention, that random domain fluctuation is a dominant component of local variability of polarization properties for small ferroelectric devices, such as ferroelectric capacitors in FRAM memory cells, which can be as small as on the order of 0.35 µm².

Ferroelectric material, such as PZT, typically has a grain structure when formed in a thin film, such as in the integrated circuit context. It has been observed that the grain size of the ferroelectric thin film correlates to the density of polarization domains per unit area. For example, samples of PZT material formed according to conventional methods have been observed to include domains that are each on the order of 25 to 100 nm in width, disposed in grains of a size on the order of 800 to 2000 nm across. And as discussed above, each domain exhibits specific coercive voltages $V_\alpha$ and $V_\beta$. As described above in connection with FIGS. 6a and 6b, a probability density function can be identified for these coercive voltages $V_\alpha$ and $V_\beta$ over a large number of ferroelectric domains, whether on the same wafer or over a larger population. However, it has been observed, in connection with this invention, that the polarization properties of small ferroelectric capacitors essentially follow a random sampling from that overall probability density function. Small capacitors, such as those used to realize FRAM memory cells, have a relatively small number of domains. For example, a 0.35 µm² capacitor having PZT as its ferroelectric material will typically consist of thirty to forty polarization domains. The polarization characteristic of this capacitor depends on the cumulative polarization behavior of those individual domains. But because the number of domains within a given capacitor is relatively small, as compared with the number of domains on which the probability density function is defined, significant sampling variation becomes evident in the polarization characteristic of small capacitors, both relative to the average polarization characteristic and relative to one another. As stated above, it has been observed that this random domain fluctuation is the dominant component of local variability of polarization properties for small ferroelectric devices.

Embodiments of this invention enable the construction of models of ferroelectric devices, such as capacitors, that include similar local variability due to random domain fluctuation as that observed in actual small ferroelectric devices such as memory cell capacitors. As a result, the simulation of electronic circuits including these ferroelectric device models will more faithfully represent the behavior of actual circuits, especially in large-scale simulation in which many modeled ferroelectric devices of small size are included. In addition, embodiments of this invention allow for Monte Carlo statistical analysis of circuit simulations that lends insight into the expected variability of circuit operation over a large population, and that enables evaluation of circuit or process changes relative to that variability. Other analysis, such as corner or worst-case simulation can also be investigated.

As described above, the Q-V characteristic for a given domain $15_k$ can be expressed in terms of its coercive voltages $V_\alpha(k)$ and $V_\beta(k)$ as:

$$Q_k = \theta_{-1}(k) \cdot r(t) \cdot \tanh\left(2\frac{V - V_\alpha(k)}{V_{sc}}\right), \text{ for } V < V_\alpha(k)$$

and $$Q_k = \theta_{-1}(k)\left[1 - \frac{(V - V_\alpha(k) - V_{sc})^2}{V_{sc}^2}\right], \text{ for } V \geq V_\alpha(k)$$

for the "−1" state, where $V_{sc}$ represents the width of the transition voltage band VSC in FIG. 4, and $$Q_k = \theta_{+1}(k) \cdot r(t) \cdot \tanh\left(2\frac{V - V_\beta(k)}{V_{sc}}\right), \text{ for } V > V_\beta(k)$$

and $$Q_k = \theta_{+1}(k)\left[1 - \frac{(V - V_\beta(k) - V_{sc})^2}{V_{sc}^2}\right], \text{ for } V \leq V_\beta(k)$$

for the "+1" state. According to embodiments of this invention, the $\theta_{-1}(k)$ and $\theta_{+1}(k)$ values incorporate a randomized factor that reflects the local variability exhibited in small ferroelectric devices, as a result of the random domain fluctuations described above.

As described above, weighting function $W_j(V_\alpha(j), V_\beta(j))$ represents a probability density function that expresses the likelihood that a domain $15_k$ will have the particular coercive voltages $V_\alpha(j), V_\beta(j)$. In embodiments of this invention and as described above relative to FIGS. 6a and 6b, this weighting function $W_j(V_\alpha(j), V_\beta(j))$ is considered in the form of gridcells 25, such that the value of weighting function $W_j(V_\alpha(j), V_\beta(j))$ corresponds to the likelihood that a single domain $15_k$ has coercive voltages $V_\alpha(j), V_\beta(j)$ within the corresponding gridcell $25_j$. For a ferroelectric device of area A, and in which the number of domains 15 per unit area in the ferroelectric material is represented by density ρ, one can therefore evaluate an expected number <N> of domains 15 to be within a single gridcell 25 having coercive voltages $V_\alpha, V_\beta$ as:

$$<N>(V_\alpha, V_\beta) = W(V_\alpha, V_\beta) \cdot \rho \cdot A$$

Essentially, this equation multiplies the expected number of domains having a given pair of coercive voltage values based on the probability density function for a gridcell 25, by the number of domains 15 in the device being modeled. It is contemplated that, for small area capacitors, the expected number <N> of domains will be relatively low (i.e., <1.0) for most gridcells 25.

According to embodiments of this invention, the model for each ferroelectric device in the circuit being simulated is derived by a random sampling of domain ferroelectric characteristics according to the operative probability density function for each gridcell 25 (a gridcell probability distribution). A random number is applied to the gridcell probability distribution for each gridcell 25, to select the number of domains 15 that are associated with that gridcell 25. The polarization characteristic of each domain 15 in the modeled ferroelectric element then corresponds to the polarization characteristics of its associated gridcell 25. Superposition of these domain-level polarization characteristics from all domains 15 generates an instance of a model of the polarization characteristic for the ferroelectric element. As a result, the model for small ferroelectric devices is determined by a random process that mimics the randomness of the polarization behavior in actual ferroelectric devices of the same size (in number of domains).

In one embodiment of the invention, the gridcell probability distribution assigned to a given gridcell 25 of the gridded probability density function is a Poisson distribution. As known in the art, the Poisson distribution function $f(h; \lambda)$ expresses the probability of h events occurring within a given time interval, where $\lambda$ represents the expected value of the number of events occurring in that interval:

$$f(h; \lambda) = \frac{\lambda^h e^{-\lambda}}{h!}$$

The Poisson function $f(h; \lambda)$ thus defines a probability mass function for a given expected value $\lambda$, essentially assigning a probability value for each non-negative integer value h. According to this embodiment of the invention, a random number is selected for each gridcell $25_j$ in the gridded probability distribution function $W_j(V_\alpha(j), V_\beta(j))$, and applied to the Poisson distribution for that gridcell $15_j$ (as determined by the expected number <N>$_j$ of domains 15 to be within that gridcell $25_j$). Based on this random sample, a integer number $N_j$ of domains 15 is assigned to that gridcell $25_j$ for that particular instance of the modeled ferroelectric element.

For example, the approximate probabilities according to the Poisson for expected numbers <N>$_j$ of 1.0 and 2.0 are:

| Number of domains $N_j$ | Probability for <N>$_j$ = 1.0 | Probability for <N>$_j$ = 2.0 |
| --- | --- | --- |
| 0 | 0.37 | 0.14 |
| 1 | 0.37 | 0.27 |
| 2 | 0.18 | 0.27 |
| 3 | 0.06 | 0.18 |
| 4 | 0.02 | 0.09 |
| 5 | <0.01 | 0.04 |
| 6 | <0.01 | 0.01 |

Of course, the expected number <N>$_j$ is not restricted to integer values, and can range from zero to any reasonable positive number depending on the probability density function and the size of the modeled ferroelectric element (i.e., number of domains). As mentioned above, for small area capacitors, the expected number <N>$_j$ will typically be less than 1.0 for many, if not all, gridcells $25_j$. After determining the Poisson distribution for that expected number <N>$_j$, the Poisson probabilities for the likely integer values can be assigned to a range, e.g., [0.000 to 1.000]. For the example of the above table in which expected number <N>$_j$=1.0, the range can be subdivided as follows:

| Number of domains $N_j$ | For random numbers between: |
| --- | --- |
| 0 | 0.00 < x < 0.37 |
| 1 | 0.37 < x < 0.74 |
| 2 | 0.74 < x < 0.92 |
| 3 | 0.92 < x < 0.98 |
| 4 | 0.9800 < x < 0.9990 |
| 5 | 0.9990 < x |

In this case, the probability that 6 or more domains will be selected is so slight that it can be ignored. A conventional random number generator is then executed by simulation system 50 to select a random number x within this range. That random number is mapped to the assigned Poisson probabilities for the gridcell $25_j$ to retrieve an integer number $N_j$. This integer $N_j$ is thus selected randomly but according to a Poisson distribution corresponding to the expected number <N>$_j$ for that gridcell $25_j$. Of course, other probability distributions besides the Poisson distribution may be used for the gridcell probability distributions, if desired.

On the average, the sum of the integer numbers $N_j$ of domains 15 of a modeled ferroelectric element assigned to all of the gridcells 25 will equal the expected number of domains 15 for that element:

$$\sum_j N_j = \rho \cdot A$$

Of course, given that each integer number $N_j$ is based on a random sampling of a probability distribution, this equation will not hold in all instances.

Figure 9A:
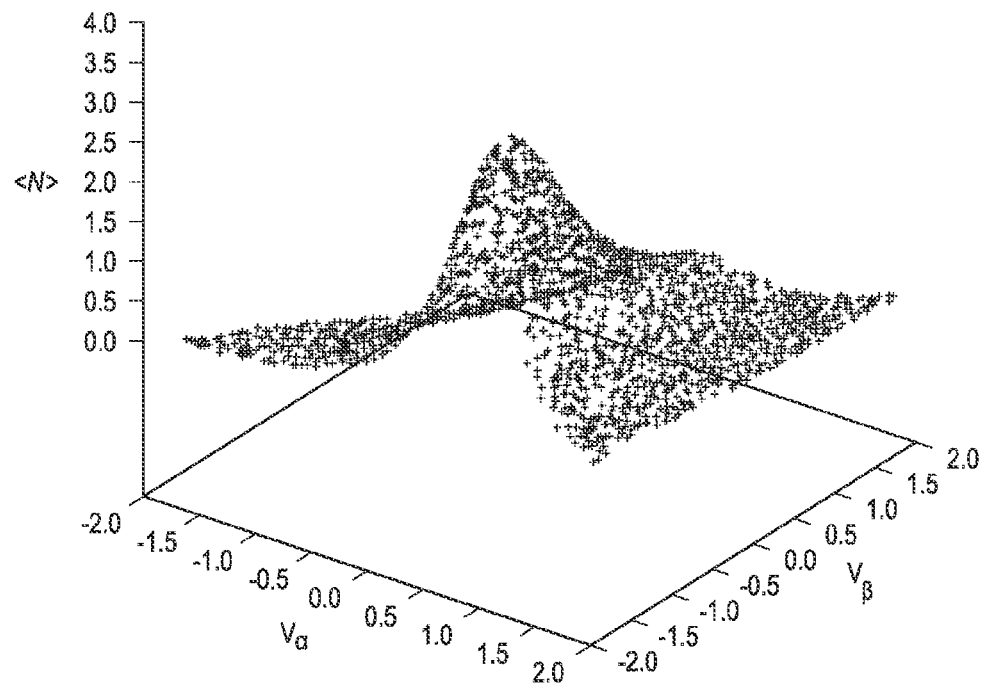
FIG. 9a is a scatter plot of an example of a probability distribution of domains over coercive voltages.
Figure 9B:
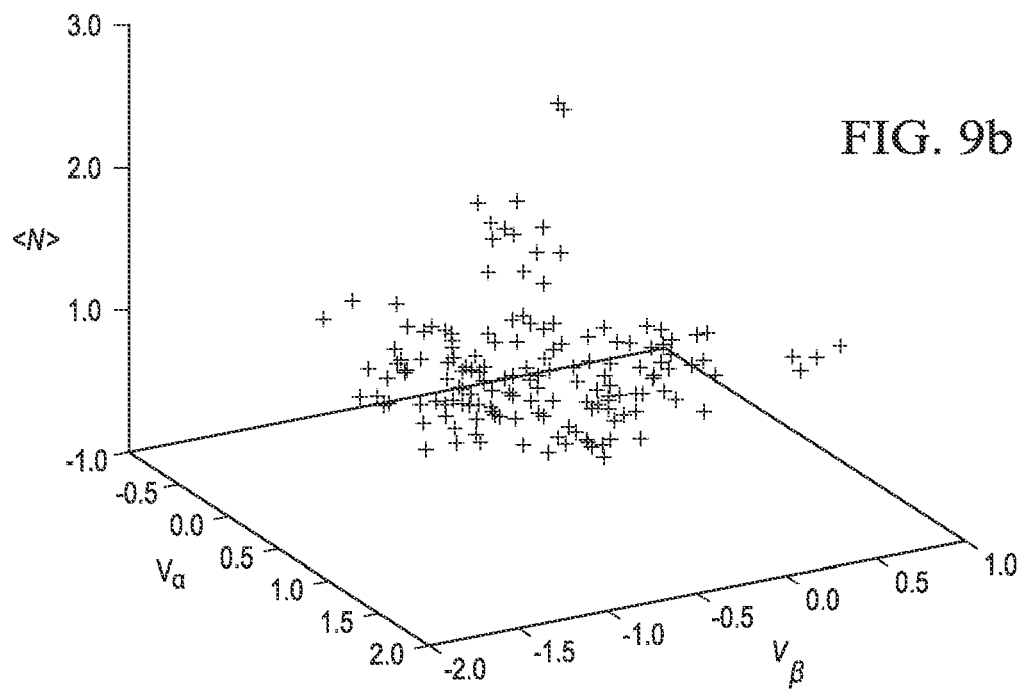
FIGS. 9b and 9c are scatter plots illustrating examples of sampled polarization characteristics based on random sampling of the probability distribution of FIG. 9a, according to embodiments of the invention.
Figure 9C:
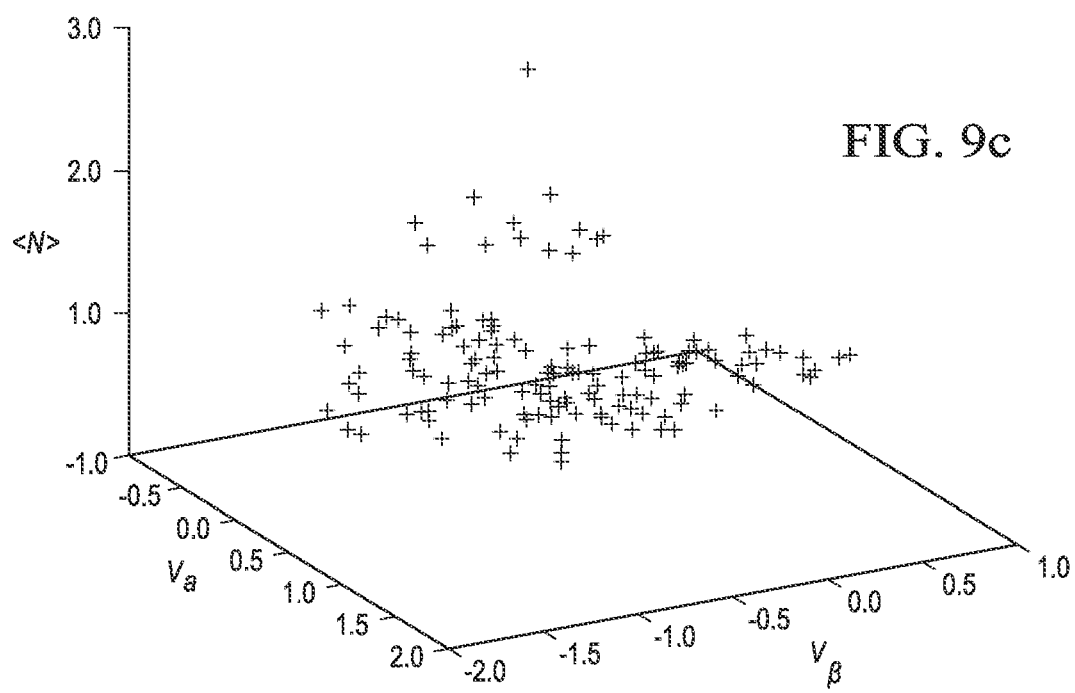

For models of relatively small ferroelectric devices, such as ferroelectric capacitors in FRAM memory cells, this random assignment of domains 15 to gridcells 25 will result in substantial variation among the modeled devices. By way of example, FIG. 9a illustrates a probability distribution function of the expected number <N> of domains within each gridcell within a voltage space of coercive voltages $V_\alpha$, $V_\beta$, each ranging from −2 volts to +2 volts. As evident from FIG. 9a, the gridcell assignment is quite dense, with the expected value <N> ranging from zero or close to zero (for a relatively high number of gridcells) to as high as three domains per gridcell (for relatively few gridcells). FIG. 9b illustrates a random sampling from the probability density function of FIG. 9a for a first instance of a modeled ferroelectric capacitor 10. As evident from the foregoing description and as shown in FIG. 9a, this ferroelectric capacitor 10 has about one hundred domains 15, which are randomly assigned to gridcells 25 according to the underlying probability density function of FIG. 9a and the resulting Poisson distributions for each gridcell 25. The result of the sampling is the distribution of domain-level coercive voltages coercive voltages $V_\alpha$, $V_\beta$ as shown in FIG. 9b. As evident in that Figure, most voltage gridcells 25 in this sampling will be represented by one domain 15 in the modeled capacitor 10, a few will be represented by two domains 15, and two gridcells 25 will be represented by three domains 15. FIG. 9c illustrates a second instance of a model for a ferroelectric capacitor 10 of the same construction as that corresponding to FIG. 9b, again using the probability density function of FIG. 9a and resulting Poisson distributions for each gridcell 25. The differences between the models illustrated in FIGS. 9b and 9c reflect the effects of sampling variation, considering that the total number n of domains 15 in the ferroelectric capacitor 10, as modeled in FIGS. 9b and 9c, is relatively small compared to the number m of gridcells 25 in the probability distribution function of FIG. 9a. This sampling variation has been observed to correspond well to the variation due to random domain fluctuations that is encountered in actual ferroelectric devices.

According to this embodiment of the invention, the $\theta_{-1}$ and $\theta_{+1}$ values for each domain $15_k$ in the modeled incorporate a randomized factor that reflects the local variability exhibited in small ferroelectric devices, as a result of the random domain fluctuations described above. These $\theta_{-1}$ and $\theta_{+1}$ values are reflected in calculating the overall polarization characteristic of modeled ferroelectric capacitor 10, in this embodiment of the invention, as will now be described. For a domain $15_k$, its $\theta_{-1}$ and $\theta_{+1}$ values (for the +1 and −1 polarization states, respectively) will now include a factor reflective of the randomly-selected number $N_i$ of domains selected for the same gridcell $25_i$ to which that domain $15_k$ belongs:

$$\theta_{-1}(k) = \theta_{-1}{}^o \cdot x_i$$

$$\theta_{+1}(k) = \theta_{+1}{}^o \cdot x_i$$

where $\theta_{-1}{}^o$ and $\theta_{+1}{}^o$ are nominal single-domain dipole moments in the model, and where $x_i$ is a normalization of the randomly-selected number $N_i$ domains for gridcell $25_i$ relative to the expected value $<N>_i$ for that gridcell, as determined according to the overall probability distribution function:

$$x_i = \frac{N_i}{<N>_i}$$

These $\theta_{-1}(k)$ and $\theta_{+1}(k)$ values are thus incorporated into the expressions for the Q-V characteristic for a given domain $15_k$, in terms of its coercive voltages $V_\alpha(k)$ and $V_\beta(k)$ as:

$$Q_k = \theta_{-1}(k) \cdot r(t) \cdot \tanh\left(2\frac{V - V_\alpha(k)}{V_{sc}}\right), \text{ for } V < V_\alpha(k)$$

and $$Q_k = \theta_{-1}(k)\left[1 - \frac{(V - V_\alpha(k) - V_{sc})^2}{V_{sc}^2}\right], \text{ for } V \geq V_\alpha(k)$$

for the "−1" state, and $$Q_k = \theta_{+1}(k) \cdot r(t) \cdot \tanh\left(2\frac{V - V_\beta(k)}{V_{sc}}\right), \text{ for } V > V_\beta(k)$$

and $$Q_k = \theta_{+1}(k)\left[1 - \frac{(V - V_\beta(k) - V_{sc})^2}{V_{sc}^2}\right], \text{ for } V \leq V_\beta(k)$$

for the "+1" state. The overall Q-V characteristic for the modeled ferroelectric element is the superposition of these single-domain Q-V characteristics, over all of its domains 15. This superposition may be performed by superposing the Q-V characteristics of the grid of gridcells 25, considering that those gridcells $25_i$ to which no domain is assigned will have a zero-valued dipole moment values $\theta_{-1}$ and $\theta_{+1}$ according to this approach.

According to embodiments of the invention, therefore, random domain fluctuation that is observed in small ferroelectric elements, because of the relatively few ferroelectric domains of those small elements and thus because of the sampling variation of those few domains relative to the overall probability distribution function, can be accounted for in the modeling of these small ferroelectric elements. Simulation of worst-case or "corner" circuit performance caused by these variations in polarization, or of an overall statistical distribution of circuit performance by way of Monte Carlo analysis, can be readily performed.

Modeling and Simulation System

Figure 10:
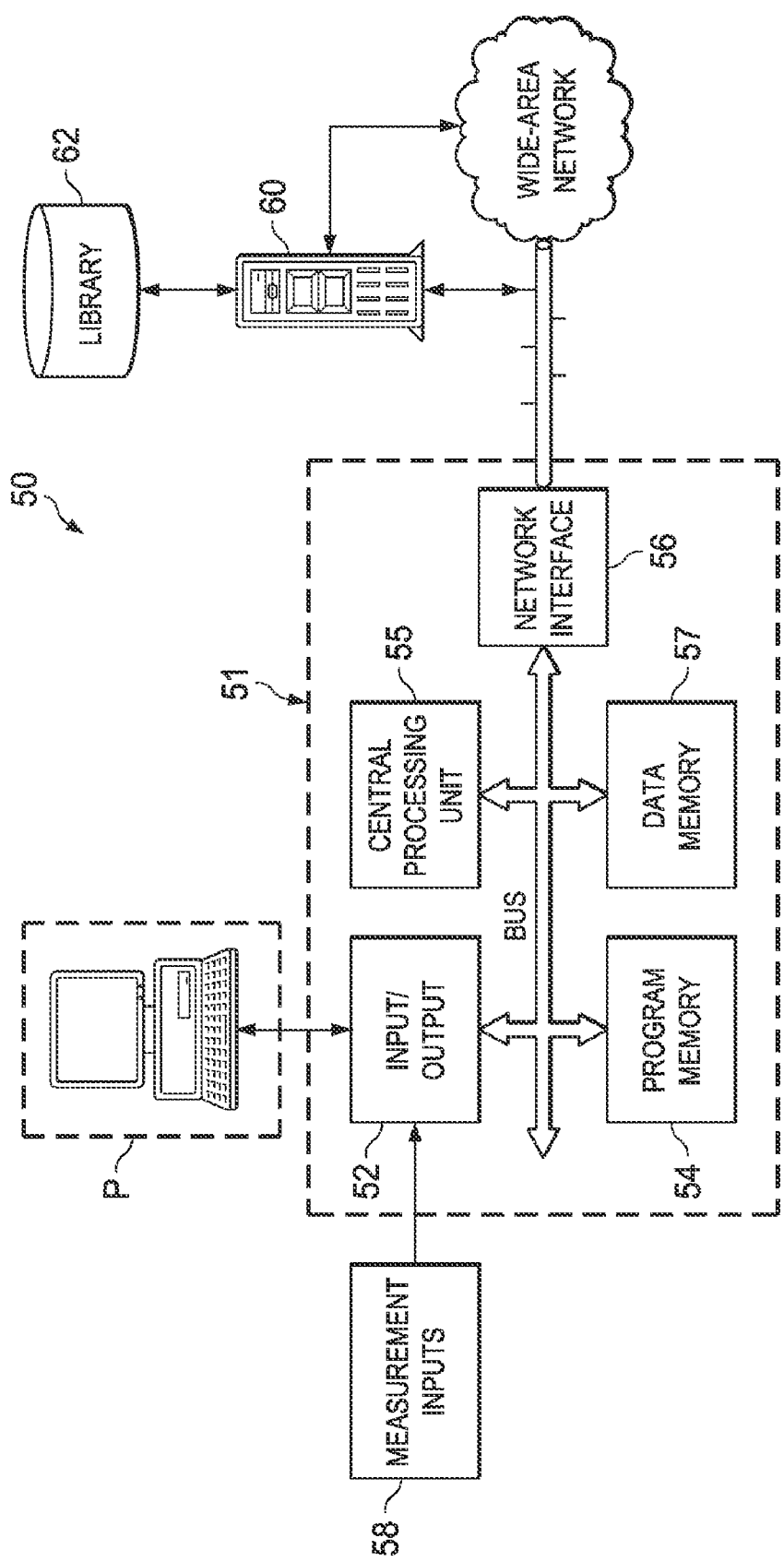
FIG. 10 is an electrical diagram, in block form, of a computer system for modeling and simulation of electronic circuits including ferroelectric elements, according to embodiments of this invention.

According to the foregoing description, the theory of the model used to represent multi-domain ferroelectric capacitor 14 within the parallel component representation of ferroelectric capacitor 10, according to this embodiment of the invention, has been described. Referring now to FIG. 10, computing system 50 for deriving and storing the model, and for applying that model in the simulation of an electronic circuit including ferroelectric capacitor 10, according to embodiments of the invention, will now be described.

FIG. 10 illustrates the construction of modeling and simulation system 50 according to an example of an embodiment of the invention, which performs the operations described in this specification to model ferroelectric capacitor 10 and to simulate the behavior of ferroelectric capacitor 10 in an electronic circuit. In this example, modeling and simulation system 50 is as realized by way of a computer system including workstation 51 connected to server 60 by way of a network. Of course, the particular architecture and construction of a computer system useful in connection with this invention can vary widely. For example, modeling and simulation system 50 may be realized by a single physical computer, such as a conventional workstation or personal computer, or alternatively by a computer system implemented in a distributed manner over multiple physical computers. Accordingly, the generalized architecture illustrated in FIG. 10 is provided by way of example only.

As shown in FIG. 10, workstation 51 includes central processing unit 55, coupled to system bus BUS. Also coupled to system bus BUS is input/output interface 52, which refers to those interface resources by way of which peripheral functions P (e.g., keyboard, mouse, display, etc.) interface with the other constituents of workstation 51. Central processing unit 55 refers to the data processing capability of workstation 51, and as such may be implemented by one or more CPU cores, co-processing circuitry, and the like. The particular construction and capability of central processing unit 55 is selected according to the application needs of workstation 51, such needs including, at a minimum, the carrying out of the functions described in this specification, and also including such other functions as may be desired to be executed by modeling and simulation system 50. In the architecture of modeling and simulation system 10 according to this example, program memory 54 and data memory 57 are coupled to system bus BUS.

Program memory 54 stores the computer instructions to be executed by central processing unit 55 in carrying out those functions. More specifically, program memory 54 is a computer-readable medium storing executable computer program instructions according to which the operations described in this specification are carried out by modeling and simulation system 50, specifically by central processing unit 55 of workstation 51. Alternatively, these computer program instructions may be stored at and executed by server 60, in the form of a "web-based" application, upon input data communicated from workstation 51, to create output data and results that are communicated to workstation 51 for display or output by peripherals P in a form useful to a human user. Data memory 57 provides memory resources of the desired type useful as data memory for storing input data and the results of processing executed by central processing unit 55. Of course, this memory arrangement is only an example, it being understood that data memory 57 and program memory 54 may be included within a unified physical memory resource, or distributed in whole or in part outside of workstation 51. In addition, as shown in FIG. 10, measurement inputs 58 that are acquired from laboratory tests and measurements, or as design parameters, are input via input/output function 52, and stored in a memory resource accessible to workstation 51, either locally or via network interface 56.

Network interface 56 of workstation 51 is a conventional interface or adapter by way of which workstation 51 accesses network resources on a network. As shown in FIG. 10, the network resources to which workstation 51 has access via network interface 56 includes server 60, which resides on a local area network, or a wide-area network such as an intranet, a virtual private network, or over the Internet, and which is accessible to workstation 51 by way of one of those network arrangements and by corresponding wired or wireless (or both) communication facilities. In this embodiment of the invention, server 60 is a computer system, of a conventional architecture similar, in a general sense, to that of workstation 51, and as such includes one or more central processing units, system buses, and memory resources, network interface functions, and the like. Library 62 is also available to server 60 (and perhaps workstation 51 over the local area or wide area network), and stores model calculations, previous model results, actual electrical measurements for use in correlation with current models, and other archival or reference information useful in modeling and simulation system 50. Library 62 may reside on another local area network, or alternatively be accessible via the Internet or some other wide area network. It is contemplated that library 62 may also be accessible to other associated computers in the overall network.

Of course, the particular memory resource or location at which the measurements, library 62, and program memory 54 physically reside can be implemented in various locations accessible to modeling and simulation system 50. For example, these data and program instructions may be stored in local memory resources within workstation 51, within server 60, or in remote memory resources that are network-accessible to these functions. In addition, each of these data and program memory resources can itself be distributed among multiple locations, as known in the art. It is contemplated that those skilled in the art will be readily able to implement the storage and retrieval of the applicable measurements, models, and other information useful in connection with this embodiment of the invention, in a suitable manner for each particular application.

According to this embodiment of the invention, by way of example, program memory 54 stores computer instructions executable by central processing unit 55 to carry out the functions described in this specification, by way of which the behavior of a modeled example of ferroelectric capacitor 10 can be evaluated. These computer instructions may be in the form of one or more executable programs, or in the form of source code or higher-level code from which one or more executable programs are derived, assembled, interpreted or compiled. Any one of a number of computer languages or protocols may be used, depending on the manner in which the desired operations are to be carried out. For example, these computer instructions may be written in a conventional high level language, either as a conventional linear computer program or arranged for execution in an object-oriented manner. These instructions may also be embedded within a higher-level application. For example, it is contemplated that the model of ferroelectric capacitor 10 described herein is especially useful when applied to an electronic circuit simulation using a simulation environment based on the well-known Simulation Program with Integrated Circuit Emphasis, commonly referred to as SPICE, originated at the Electronics Research Laboratory of the University of California, Berkeley. Many commercial versions of the SPICE program are now available in the industry, including several versions that are internal or proprietary to integrated circuit manufacturers.

It is contemplated that those skilled in the art having reference to this description will be readily able to realize, without undue experimentation, this embodiment of the invention in a suitable manner for the desired installations. Alternatively, these computer-executable software instructions may be resident elsewhere on the local area network or wide area network, or downloadable from higher-level servers or locations, by way of encoded information on an electromagnetic carrier signal via some network interface or input/output device. The computer-executable software instructions may have originally been stored on a removable or other non-volatile computer-readable storage medium (e.g., a DVD disk, flash memory, or the like), or downloaded as encoded information on an electromagnetic carrier signal, for example in the form of a software package from which the computer-executable software instructions were installed by modeling and simulation system 50 in the conventional manner for software installation.

Operation of the Model

Characterization of the Model

The operation of modeling and simulation system 50 in carrying out embodiments of this invention will now be described, by way of particular examples. As described above, it is contemplated that variations and alternatives to this method of operation will be apparent to those skilled in the art having reference to this specification, and that such variations and alternatives are encompassed within the scope of this invention as claimed. More specifically, FIG. 11 illustrates an example of a method for deriving a model of ferroelectric capacitor 10 at a point in time shortly after its manufacture, and at a point in time near the end-of-life of ferroelectric capacitor 10, respectively.

Figure 11:
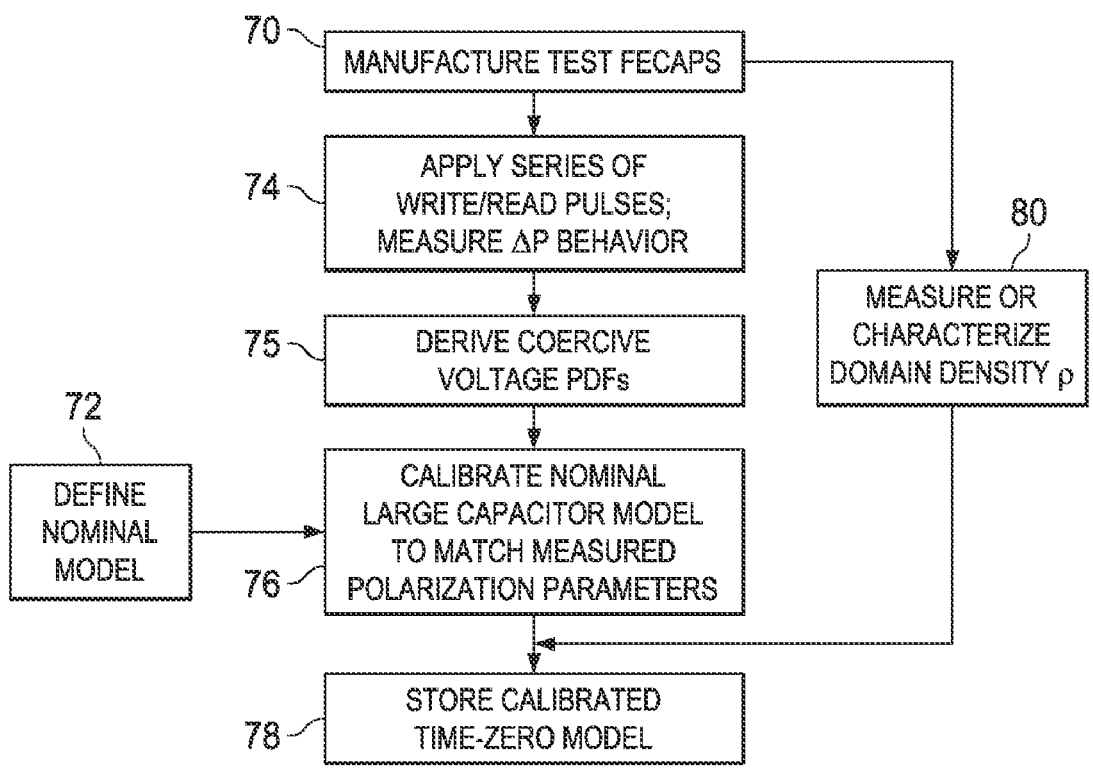
FIG. 11 is a flow diagram illustrating a method of establishing model parameters for ferroelectric elements in connection with embodiments of this invention.

Referring to FIG. 11, ferroelectric capacitors for purposes of electrical characterization are manufactured in process 70. As known in the art, these ferroelectric capacitors are intended to resemble the ferroelectric capacitor 10 to be modeled, and as such are preferably fabricated according to a similar manufacturing technology (e.g., using the same ferroelectric polarizable dielectric material), and of similar dimensions in capacitor area and polarizable dielectric thickness. For best results in deriving and calibrating a nominal model of ferroelectric capacitor 10, these manufactured ferroelectric capacitors should be of a relatively large size, so that local variability in polarization characteristics due to random domain fluctuation is not present to a significant extent. To the extent that the ferroelectric capacitors manufactured in process 70 differ from the ferroelectric capacitor 10 to be modeled, the behavioral effect of such differences may be considered by way of extrapolation. Of course, it is contemplated that the fidelity of the model and simulation is improved to the extent that the test ferroelectric capacitors manufactured in process 70 resemble ferroelectric capacitor 10 being modeled.

According to embodiments of this invention, it is useful and efficient to begin the modeling of ferroelectric capacitor 10 from the starting point of a "nominal" polarization model, and then adjusting that nominal model based on the results of measured electrical behavior. Accordingly, in process 72, a nominal model for ferroelectric capacitor 10 is defined and stored in memory of modeling and simulation system 50, for example in data memory 57 or library 62 in the example of FIG. 10.

Following the manufacture of test ferroelectric capacitors in process 70, one or more of test ferroelectric capacitors are electrically exercised in process 74, and their behavior in response to such electrical exercise measured. It is contemplated that any conventional approach to the characterization of ferroelectric capacitors, specifically those approaches intended to measure establish polarization curves including outer saturation loops and minor loops such as shown by way of example in FIGS. 4 and 7, may be used in process 74.

As described above in connection with FIG. 3, ferroelectric capacitor 10 is modeled according to embodiments of this invention as multiple components in parallel, including non-polarizable capacitor 12 in parallel with multi-domain ferroelectric capacitor 14. As such, measurement process 74 includes electrical measurements of the non-polarizable capacitance and other electrical behavior (leakage, parasitic inductance, etc.) that does not depend on the polarization state of ferroelectric capacitor 10.

Regarding the polarization-dependent behavior of ferroelectric capacitor 10, these effects are modeled by multi-domain ferroelectric capacitor 14 according to embodiments of this invention. As such, the electrical measurement of process 74 provides measurement data that are used by modeling and simulation system 50, in process 75, to derive the probability distribution function of the positive and negative coercive voltages (and correlation coefficient γ) of multi-domain ferroelectric capacitor 14, for example as shown in FIGS. 6a and 6b. For example, one approach useful in process 74 is to apply a series of write and read pulses to one or more of the test ferroelectric capacitors, by way of which the polarization state written by the write pulses is "read" by measurement of the polarization charge upon application of the read pulses. Changes in polarization of the test ferroelectric capacitors resulting from the application of read pulses of varying voltages and polarities can be used to define minor polarization loops (FIG. 7), and from these minor loops, to define the probability distribution functions of positive and negative coercive voltages such as shown in FIGS. 6a and 6b, in process 75. For example, as described above, the execution of process 75 by system 50 can create a probability distribution function $W_k$ for a given domain 15$_k$, with coercive voltage levels $V_\alpha(k)$ and $V_\beta(k)$, as:

$$W_k(V_\alpha(k), V_b(k)) = N\exp\left[-\left(\frac{V_\alpha(k)-V_{\alpha 0}}{\sigma_\alpha}\right)^2 - 2\gamma\frac{(V_\alpha(k)-V_{\alpha 0})(V_\beta(k)-V_{b 0})}{\sigma_\alpha\sigma_\beta} - \left(\frac{V_\beta(k)-V_{\beta 0}}{\sigma_\beta}\right)^2\right]$$

where γ is the correlation coefficient of coercive voltages $V_\alpha$ and $V_\beta$, where $V_{\alpha 0}$ and $V_{\beta 0}$ are calibration voltages placing the distribution at the desired place in the $V_\alpha$-$V_\beta$ plane, and where $\sigma_\alpha$ and $\sigma_\beta$ are the standard deviations of the distribution of coercive voltages $V_\alpha$ and $V_\beta$, respectively. This probability distribution function defines the distribution that is sampled in the modeling of small ferroelectric capacitors and other elements, to determine the effects of random domain fluctuation, according to embodiments of this invention.

As described above, domain density ρ is used to model the effects of random domain fluctuation, specifically in defining the number of domains expected in a modeled ferroelectric element. In addition to the determination of the probability distribution function of polarization characteristics derived in the manner described above, this embodiment of the invention includes process 80, by way of which a value of domain density ρ per unit area is physically measured in the capacitors manufactured in process 70, or otherwise characterized.

As described above, the model of multi-domain ferroelectric capacitor 14 includes a multiplicative factor that comprehends relaxation of polarization over time without applied voltage. As such, and in addition to the measurements of the coercive voltage distribution and other electrical behavior, the time duration between the write and read pulses can be selected, and varied if desired, to characterize the extent of relaxation effects, and thus to define the equations used to model relaxation in ferroelectric capacitor 10 as described above relative to FIG. 8. In summary, the relaxation effect is modeled by way of a time-dependent relaxation function r(t) for a given gridcell 25$_k$ as:

$$r(t) = \frac{n_i(t)}{n_{io}}$$

in which $n_i(t)$ represents the number of domains remaining polarized after relaxation time t:

$$n_i(t) = n_{min} + (n_{io} - n_{min})e^{-w_i t}$$

where $n_{io}$ is the number of polarizable domains 15 within gridcell 25$_k$, and $n_{min}$ is the minimum number of polarized domains remaining polarized after an arbitrarily long relaxation time t. As described above, the exponential term $w_i$ is a relaxation time constant that is constructed to reflect the dependence of relaxation on coercive voltage:

$$w_i = \lambda e^{-V_i^2/V_{sc}^2}$$

where λ is a curve-fitting constant, and where $V_i$ is the applicable coercive voltage $V_\alpha$ and $V_\beta$ for gridcell 25$_i$, depending on the current polarization state of domains 15 associated with that gridcell 25, ($V_i=V_\alpha$ for domains in the "+1" state, and $V_i=V_\beta$ for domains in the "−1" state), and where $V_{sc}$ represents the transition voltage range at the coercive voltages, as described above. It is contemplated that the curve-fitting parameter λ and the asymptotic domain numbers may be determined by electrical characterization of the test ferroelectric capacitors by varying the timing of the write and read pulses, as carried out in connection with measurement process 74. This relaxation effect can then be included in the polarization summation over all gridcells 25.

Upon acquiring the desired measurement data from process 74, for one or more samples of the test ferroelectric capacitors manufactured in process 70, modeling and simulation system 50 can then execute process 76 to calibrate the nominal model defined in process 72 to correspond to the measured polarization parameters observed in process 74. These calibration results, as well as the measurement or characterized value of domain density ρ determined in process 80, establish a calibrated large capacitor model useful in connection with the simulation of circuits including ferroelectric capacitors. This calibrated large capacitor model can then be stored in memory, for example in data memory 57 or in library 62 of system 50 (FIG. 10).

As described in commonly assigned U.S. application Ser. No. 12/394,849, incorporated herein by reference, the effects of imprint can modeled by subjecting capacitors to stress conditions that accelerate the effects of imprint and other applicable "wear-out" mechanisms. In the manner described in that application Ser. No. 12/394,849, modeling and simulation system 50 can observe and record polarization measurements for manufactured capacitors to which such stress conditions have been applied, and can then define the probability distribution functions of the coercive voltages for "later-life" models that include such imprint effects. These later-life probability distribution functions can also be used in connection with embodiments of this invention that model small ferroelectric capacitors in a manner that considers random domain fluctuation, as desired by the designer or other analyst.

Evaluation of Circuit Behavior

Following the generation of either or both of time-zero and end-of-life models, stored in processes 78, 80, the simulation of electronic circuits including ferroelectric capacitor 10 can now be carried out. Those skilled in the art with familiarity with SPICE or other computer-based electronic circuit simulation programs or packages, and having reference to this specification, will be readily able to apply the models of ferroelectric capacitor 10 produced in the manner described above to simulate the behavior of such devices and circuits in a wide variety of conditions, and in a wide variety of circuit applications. For example, ferroelectric capacitor 10 may serve as a capacitor in an analog circuit, in which the small-signal behavior of ferroelectric capacitor 10 after being polarized into one state or the other is simulated. Commonly assigned and copending U.S. application Ser. No. 12/394, 849, incorporated herein by reference, describes an example of a generalized method of operating modeling and simulation system 50 in executing such simulations. As mentioned in that application Ser. No. 12/394,849, a wide range of alternatives and variations to that operation of simulation system 50 can be employed.

Figure 12A:
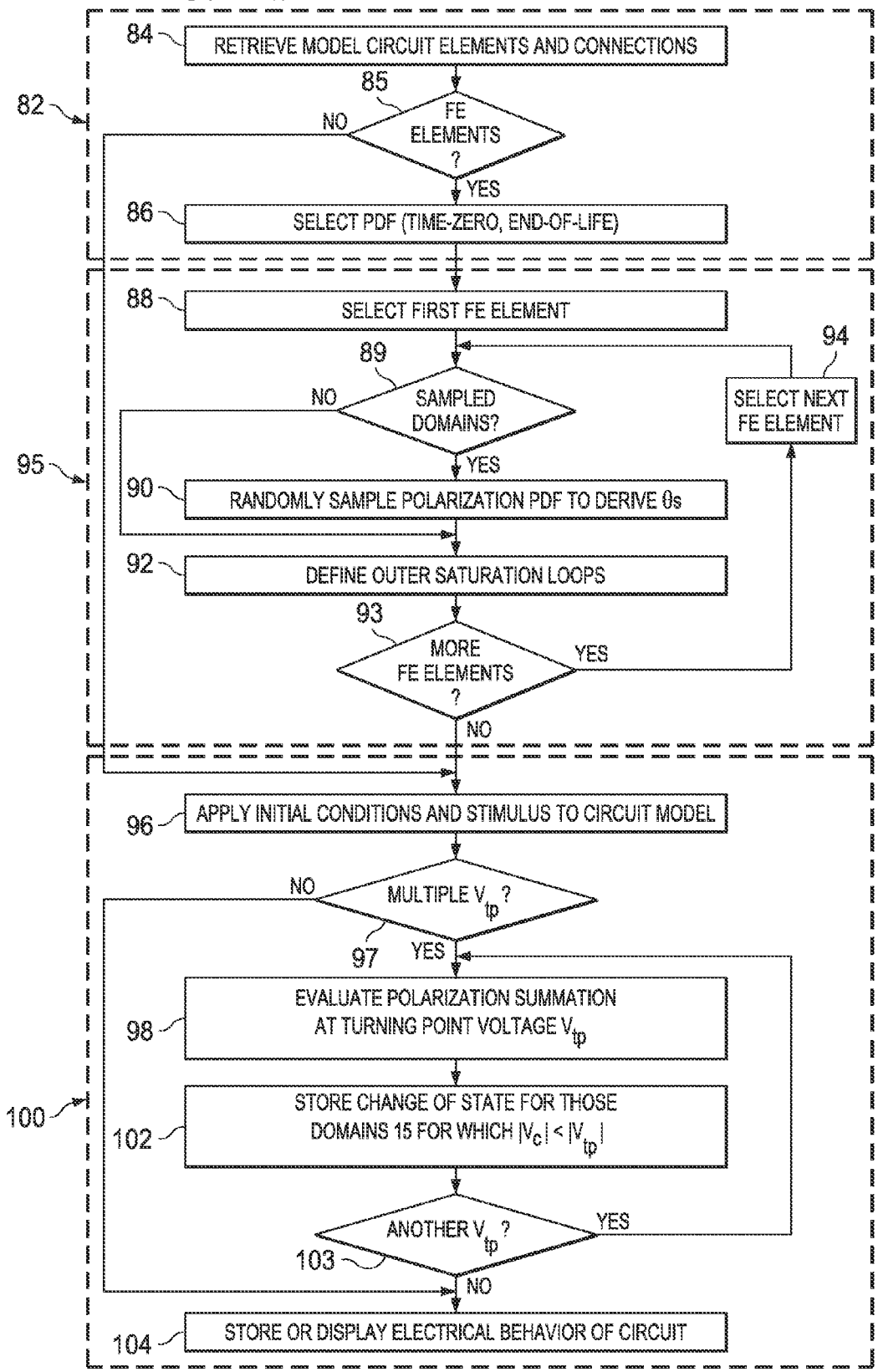
FIGS. 12a and 12b are flow diagrams illustrating the operation of embodiments of the invention in modeling ferroelectric devices according to embodiments of this invention.

FIG. 12*a* illustrates an example of the operation of simulation system 50 according to an embodiment of this invention. This example evaluates a circuit including one or more small ferroelectric elements, such as capacitors, which are modeled so that the effects of random domain fluctuation are taken into account. It is contemplated that each of the process steps performed in connection with this description of the operation of system 50 will be executed, under either user or program control, by the appropriate functions and components of system 50, depending on the particular architecture. More specifically, it is contemplated that this operation of system 50 will be performed by central processing unit 55 or such other component in system 50 in the execution of program instructions stored in program memory 54 or in some other memory resource of system 50. It is of course contemplated that the specific manner in which system 50 performs these operations can be defined by those skilled in the art having reference to this specification, as appropriate for the particular architecture of system 50 and the desired interface between system 50 and the human user.

As known in the art for SPICE and similar simulation environments, the simulation of an electronic circuit including ferroelectric capacitor 10 is based on a set of circuit elements that are associated with selected "nodes" in an overall "netlist" that specifies the circuit being simulated. Each circuit element is specified by a model, which specifies the simulated behavior of the circuit element in response to stimuli applied to that circuit element at its nodes; some nodes in the circuit will serve as inputs to the circuit being simulated, while other nodes will serve as the "output" nodes, namely as the nodes under investigation by the simulation in response to the stimuli applied at the input nodes. In addition, initial conditions may be applied at certain nodes, particularly in simulating the transient response of the circuit being simulated.

As shown in FIG. 12*a*, the appropriate model for the circuit being simulated is retrieved from library 62 or from another memory resource in simulation system 50, in process 84. It is contemplated that the retrieved circuit model includes models for each of the circuit elements, including any parasitic elements to be considered, and also the node and branch connections among those elements according to the design of the circuit being simulated. In decision 85, the presence of ferroelectric elements, such as one or more ferroelectric capacitors 10, is determined. If none (decision 85 is no), the circuit model is ready for evaluation via process 100, in the conventional manner. If one or more ferroelectric elements are included in the modeled circuit (decision 85 is yes), then one of the available probability distributions for the ferroelectric material being modeled is selected in process 86. As described above and in copending application Ser. No. 12/394,849, the modeling of a ferroelectric capacitor 10 at time-zero (shortly after manufacture) or near the end of its useful life (i.e., including the effects of imprint), or at some time in between, is determined by selecting the corresponding probability distribution function for that stage in the life of the ferroelectric material.

The defining of models for the polarization behavior of ferroelectric elements in the circuit being simulated is then performed according to this embodiment of the invention, in process 95. Beginning with a first ferroelectric element selected in process 88, for example an instance of a ferroelectric capacitor 10, decision 89 is then executed to determine whether the model for this element is to be determined by random sampling. As described above, those ferroelectric capacitors that are relatively large in size, or that, for the purposes of simulation, are to be considered as having average polarization characteristics, will not be defined by random sampling of the probability distribution. In this case (decision 89 is no), modeling and simulation is performed in the manner described in copending application Ser. No. 12/394,849, with process 92.

For small ferroelectric elements, such as small ferroelectric capacitors 10 such as those in FRAM memory cells, and in particular in the simulation of circuits in which a substantial number of such small ferroelectric elements are included, random sampling of the probability distribution for domain-level polarization enables evaluation of the effects of random domain fluctuations from capacitor to capacitor (or, more generally, from element to element). Accordingly, if the selected ferroelectric element is a small device or is otherwise to be evaluated using sampled domains, decision 89 returns a yes result, and simulation system 50 next carries out process 90 to define the polarization characteristic for this element.

Figure 12B:
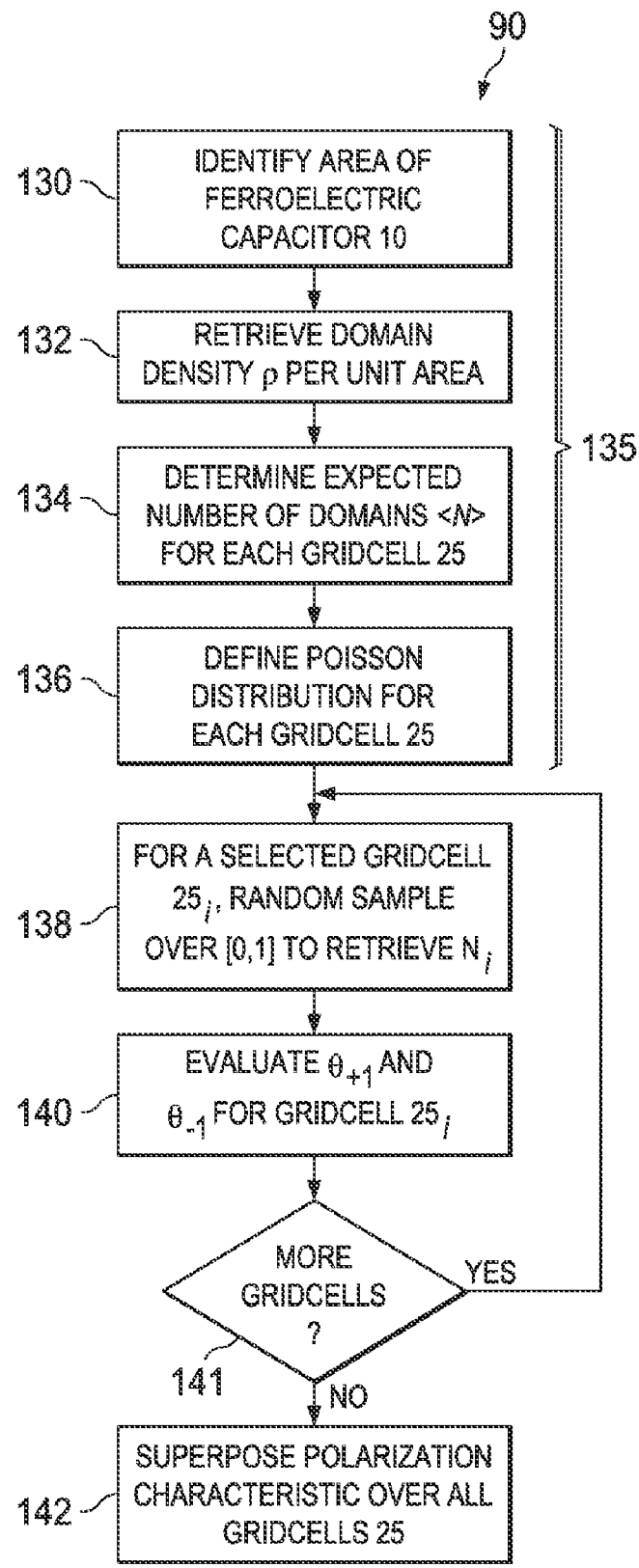

In process 90, random sampling is applied to the probability distribution function selected in process 86, to determine the polarization characteristics of the domains 15 in the ferroelectric capacitor 10 being modeled in this instance. As described above, the randomly selected polarization characteristics are reflected in the $\theta_{-1}$ and $\theta_{+1}$ values corresponding to the dipole moments of the associated gridcells 25 to which domains 15 belong. FIG. 12*b* illustrates process 90 in more detail, according to this embodiment of the invention. In process 130, the area of the particular ferroelectric element to be modeled, in this example ferroelectric capacitor 10, is identified from the circuit model previously retrieved in process 84. In process 132, domain density value ρ is retrieved by simulation system 50; as described above, this domain density value ρ indicates the average number of ferroelectric domains per unit area applicable to the circuit being simulated, as determined by measurement or other characterization (process 80 of FIG. 11). As described above, the probability density function derived in process 75 and selected in process 86 is expressed in terms of a grid of gridcells 25, in this embodiment of the invention. An expected number of domains <N> is assigned to each of these gridcells 25, in process 134 of this embodiment of the invention, by way of the expression:

$$<N>(V_\alpha, V_\beta) = W(V_\alpha, V_\beta) \cdot \rho \cdot A$$

where the $W(V_\alpha, V_\beta)$ function is the weighting function expressing the selected probability density function, and where $V_\alpha, V_\beta$ are the coercive voltages for a given gridcell 25. In process 136, a Poisson distribution is then derived for each gridcell 25 in the grid, using the expected number of domains <N> derived in process 134 for each gridcell 25, and over those integer numbers of domains that could randomly be selected for that gridcell with any reasonable likelihood (e.g., >0.01%).

These processes 130, 132, 134, 136 (referred to as process 135 in FIG. 12*b*) will return the same result for all ferroelectric capacitors 10 of a given area, considering that the domain density value ρ and probability density function remain constant for all ferroelectric elements of the same integrated circuit, regardless of area. As such, if multiple capacitors of the same size are to be included in the eventual model (e.g., in large-scale modeling of an FRAM memory), this process 135 need only be performed once for all ferroelectric elements of that same size.

In process 138, the construction of a model for an individual ferroelectric capacitor 10, in this example, begins with the random sampling of a number of domains for a first selected gridcell $25_i$ in the grid. As described above, the Poisson distribution for a given gridcell $25_i$ defines the relative probabilities of the number of domains that may have the coercive voltages associated with that gridcell $25_i$, given the expected number $<N>_i$ of domains. As such, in process 138, those relative probabilities are assigned to intervals over a selected range (e.g., [0, 1]), and a random number is generated from within that range, returning an integer number $N_i$ of domains to be assigned to that gridcell $25_i$. In process 140, the $\theta_{-1}$ and $\theta_{+1}$ values are evaluated for each domain $15_k$ associated with that gridcell $25_i$ according to:

$$\theta_{-1}(k) = \theta_{-1}^0 \cdot x_i$$

$$\theta_{+1}(k) = \theta_{+1}^0 \cdot x_i$$

where $\theta_{-1}^0$ and $\theta_{+1}^0$ are nominal single-domain dipole moments specified in the retrieved model parameters. These values then determine the polarization characteristics for the individual domains $15_k$ assigned to that gridcell $25_i$.

Decision 141 determines whether additional gridcells 25 remain to be randomly sampled. If so (decision 141 is yes), processes 138, 140 are repeated. Upon completion of the random sampling for all gridcells 25 over the range of coercive voltages $V_\alpha, V_\beta$ in the model (decision 141 is no), process 142 is then performed to superpose the polarization characteristics now defined for each of the gridcells 25 to which domains have been assigned, based on the random sampling of process 138. This superposition of domain-level polarization characteristics then defines the overall polarization characteristic for the specific ferroelectric capacitor 10 for which the model is developed in this instance of process 90.

Referring back to FIG. 12*a*, once the polarization model for this ferroelectric capacitor 10 is defined by this instance of process 90, the outer saturation loops for this modeled ferroelectric capacitor 10 are defined in process 92. These outer saturation loops reflect the polarization behavior of ferroelectric capacitor 10 for increasing and decreasing applied voltages beyond the highest coercive voltages $V_\alpha, V_\beta$ for all of the domains assigned to this ferroelectric capacitor 10. As a result, for the case of simulating an FRAM cell, for example, the effects of a "write" operation can be simulated by applying a sufficiently high amplitude write pulse to the nodes of modeled ferroelectric capacitor 10, either by way of a write circuit being simulated or by simply setting the plate voltages of ferroelectric capacitor 10 accordingly. In decision 93, simulation system 93 determines whether additional ferroelectric elements remain to be modeled; if so (decision 93 is yes), a next ferroelectric element is selected in process 94, and decision 89 and processes 90, 92 are repeated as applicable for that element.

Upon all ferroelectric elements being modeled as desired (decision 93 is no), the circuit is ready for simulation according to the desired simulation stimulus. The initial circuit conditions and the input stimulus for the intended simulation are applied to the circuit model in process 96, in the conventional manner for the type of analysis desired by the analyst (e.g., DC or operating point analysis, AC analysis, transient analysis, etc.). In any case, the simulation carried out in response to these initial circuit conditions and the input stimulus evaluates the polarization characteristic for multi-domain ferroelectric capacitor 10 in response to the voltage and current applied to nodes connected to ferroelectric capacitor 10, such evaluation including the evaluation of the superposed polarization characteristics of the randomly selected domains 15 making up ferroelectric capacitor 10, for example by summing the polarization response of each of the randomly selected domains 15. That polarization response is combined with the electrical behavior of non-polarizing capacitor 12 (FIG. 3) and any other model components included within the overall model of ferroelectric capacitor 10 to evaluate the electrical state of ferroelectric capacitor 10 in response to the simulated stimulus; this response is included in the overall model of the circuit being simulated, along with the other modeled circuit elements, to determine the result of the simulation. In decision 97, simulation system 50 determines whether multiple turning point voltages will be implicated by the simulation for the ferroelectric elements in the model (i.e., whether any minor loop history is to be simulated). If not, the results of the simulation are stored by simulation system 50 in a memory resource such as library 62, displayed or printed on an output device, or both, in process 104.

According to embodiments of the invention, as described above, the model of ferroelectric capacitor 10 is capable of comprehending applied voltages that are between the positive and negative coercive voltages, and thus capable of evaluating "minor loops" in the polarization characteristic. Such minor loop evaluation requires consideration of the initial "full" polarization state indicated by the outer saturation loops, but also the history of lower amplitude voltages applied to the nodes of ferroelectric capacitor 10. If decision 97 determines that minor loop evaluation is to be performed (decision 97 is yes), such simulation of the response of ferroelectric capacitor 10 is carried out from the state of the simulated circuit following process 96. As described above, minor loops in the polarization characteristic are encountered upon the voltage applied to ferroelectric capacitor 10 changing direction (i.e., the rate of change dV/dt changes polarity). If the applied voltage changes direction at a voltage less than the saturation coercive voltages, that applied voltage constitutes a "turning point" voltage, and defines a minor loop in the polarization characteristic. In process 98, the model of ferroelectric capacitor 10 is evaluated at such a turning point voltage $V_{Tp}$, by evaluating the polarization summation for multi-domain ferroelectric capacitor 14 over the n gridcells, at the voltage $V_{Tp}$, and for the current polarization state $X_k$ of each domain 15 associated with each of the m gridcells:

$$Q = \sum_{k=0}^{m-1} Q_k(V_{Tp}, X_k) W_k(V_\alpha(k), V_\beta(k))$$

where $W_k(V, \alpha, \beta)$ is a weighting function corresponding to the number of domains 15 that have coercive voltage levels $V_\alpha(k)$ and $V_\beta(k)$ within a given gridcell $25_k$, in process 98. The charge $Q_k$ for each domain 15 (i.e., each gridcell 25, weighted by the number of domains 15 in that gridcell 25 indicated by the weighting function) is defined, in this embodiment of the invention, by the state-dependent equations:

$$Q_k = \theta_{-1}(k) \cdot r(t) \cdot \tanh\left(2\frac{V - V_\alpha(k)}{V_{sc}}\right), \text{ for } V < V_\alpha(k)$$

and $$Q_k = \theta_{-1}(k)\left[1 - \frac{(V - V_\alpha(k) - V_{sc})^2}{V_{sc}^2}\right], \text{ for } V \geq V_\alpha(k)$$

for the "−1" state, and $$Q_k = \theta_{+1}(k) \cdot r(t) \cdot \tanh\left(2\frac{V - V_\beta(k)}{V_{sc}}\right), \text{ for } V > V_\beta(k)$$

and $$Q_k = \theta_{+1}(k)\left[1 - \frac{(V - V_\beta(k) - V_{sc})^2}{V_{sc}^2}\right], \text{ for } V \leq V_\beta(k)$$

for the "+1" state. As before, the domain dipole values $\theta_{-1}(k)$ and $\theta_{+1}(k)$ reflect the random domain fluctuation in small instances of ferroelectric capacitor 10, by way of the random selection of polarization characteristics for the domains 15 modeling that ferroelectric element, as described above. As evident from these expressions, and as described above, relaxation effects are incorporated into the polarization equation by way of the r(t) term in the tan h term; as such, evaluation process 98 can also receive an input t corresponding to a relaxation time during which ferroelectric capacitor 10 received no applied voltage. This relaxation time t depends on the particular simulation stimuli sequence, of course. The resulting polarization characteristic for multi-domain ferroelectric capacitor 10, from process 98, is combined with the electrical behavior of non-polarizing capacitor 12 (FIG. 3) and any other model components included within the overall model of ferroelectric capacitor 10, to evaluate the electrical state of ferroelectric capacitor 10 in response to the simulated stimulus.

Following the evaluation of the electrical state of ferroelectric capacitor 10 at turning point voltage $V_{Tp}$ in process 98, some of the domains 15 in the model of multi-domain ferroelectric capacitor 14 will change state in response to the applied voltage level of processes 96, 98. In particular, those domains 15 associated with the gridcells 25 in which the turning point voltage $V_{Tp}$ exceeds either the positive or negative coercive voltage, as the case may be. Modeling and simulation system 50 comprehends those domains 15 that change state as a result of the applied voltage $V_{Tp}$, and stores the change of state for those domains 15 in data memory 57, in process 102.

If another "turning point" voltage is to be encountered in this sequence of input stimuli (decision 103 is "yes"), then evaluation process 98 is performed again to evaluate the polarization summation of multi-domain ferroelectric capacitor 14 at this new voltage, including the electrical evaluation of ferroelectric capacitor 10 as a whole if desired, with any changes in the polarization state of domains 15 within multi-domain ferroelectric capacitor 14 stored in process 102. This process continues throughout the sequence of simulated applied voltages to ferroelectric capacitor 10.

Upon the end of the simulated stimuli applied to ferroelectric capacitor 10 (decision 103 is "no"), modeling and simulation system 50 then stores or displays the results of the simulation, in process 104. As known in the art for SPICE and similar simulation environments, the manner in which the output of a simulation is presented or otherwise managed is determined by user configuration or input. For example, a common output from a SPICE simulation is a plot of signal levels at the selected output nodes over a time interval, either as displayed on a graphics display of workstation 51 or output by way of a printed hard copy, or both. Alternatively, or in addition, the result of the simulation performed in the manner illustrated in FIG. 12a can be stored in library 62 for later use, comparison, or analysis in the conventional manner.

As evident from this description, embodiments of this invention provide the ability to incorporate the effects of random domain fluctuation into models of ferroelectric elements such as ferroelectric capacitor 10. These random effects may be incorporated into a single pass simulation of the modeled circuit, as described above relative to FIGS. 12a and 12b.

Figure 13A:
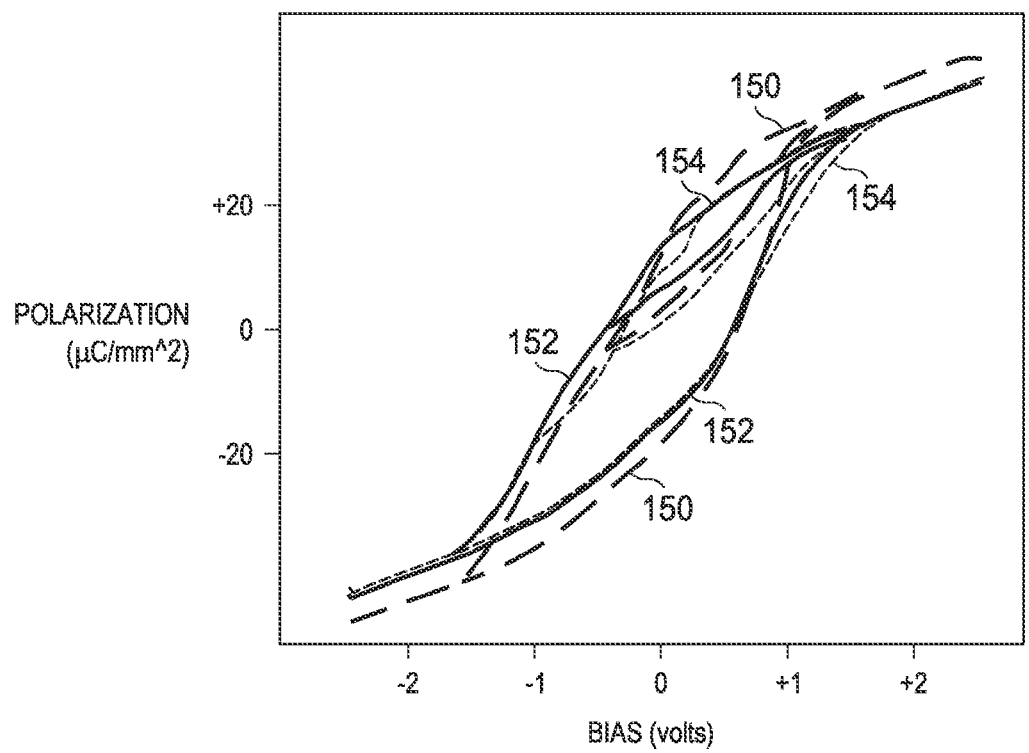
FIGS. 13a and 13b are plots of polarization characteristics for multiple samples of small and large ferroelectric capacitors, as modeled according to embodiments of this invention.

The effects of random domain fluctuation are especially evident in small ferroelectric capacitors 10. FIG. 13a illustrates examples of the outer loop polarization characteristics (and one minor loop) created by process 92 of this embodiment of the invention, for three samples of ferroelectric capacitors 10 that are all of the same size and model parameters, but which were each defined according to the random sampling of process 90. In this FIG. 13a, each of curves 150, 152, 154 correspond to the polarization characteristic of a modeled ferroelectric capacitor 10 of a size 0.325 μm², which for a typical domain density value ρ of 200 domains/μm², amounts to about 60 to 65 domains per capacitor. With this relatively small number of domains defining a capacitor, three separate random samplings resulted in the three polarization curves 150, 152, 154 shown in FIG. 13a. As evident from that Figure, the coercive voltages differ as a result of this random sampling, as does the full polarization charge (curve 150 showing more polarization charge in both fully polarized +1 and −1 states than do curves 152, 154). In addition, curves 150, 152, 154 each show some piece-wise granularity, which is necessarily caused by the relatively small number of domains.

Figure 13B:
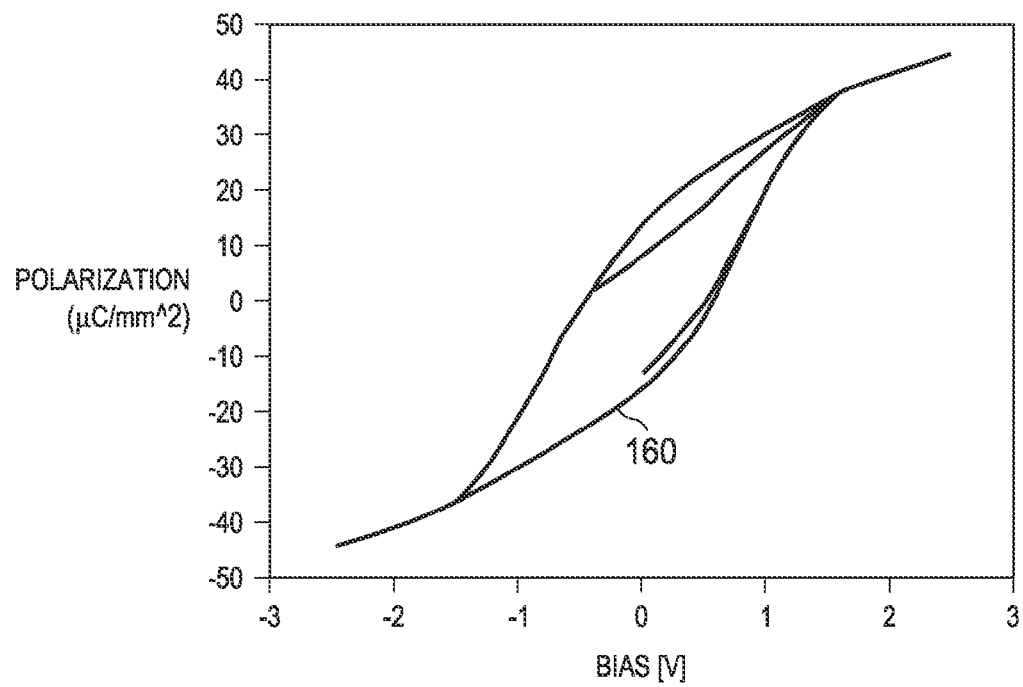

In contrast, curve 160 in FIG. 13b illustrates the polarization curves for three randomly sampled ferroelectric elements of larger size. In this example, the ferroelectric capacitors 10 characterized in FIG. 13*b* are each 2.000 µm² in area, which for a typical domain density value ρ of 200 domains/µm², amounts to about 400 domains per capacitor. With this relatively large number of domains, repeated instances of the random sampling of processes 90, 92 tend toward the same result, as the larger sample size necessarily reduces the sampling variability from capacitor to capacitor. Curve 160 is thus effectively an overlay of the polarization characteristics from each of those three capacitors, with little to distinguish among the three. In addition, the granularity evident in FIG. 13*a* has also disappeared, again due to the larger sample size.

According to embodiments of this invention, these random effects caused by random domain fluctuation can themselves be characterized by way of simulation. Examples of simulation designs useful in performing such characterization will now be described in connection with FIGS. 14*a* through 14*c*.

Figure 14A:
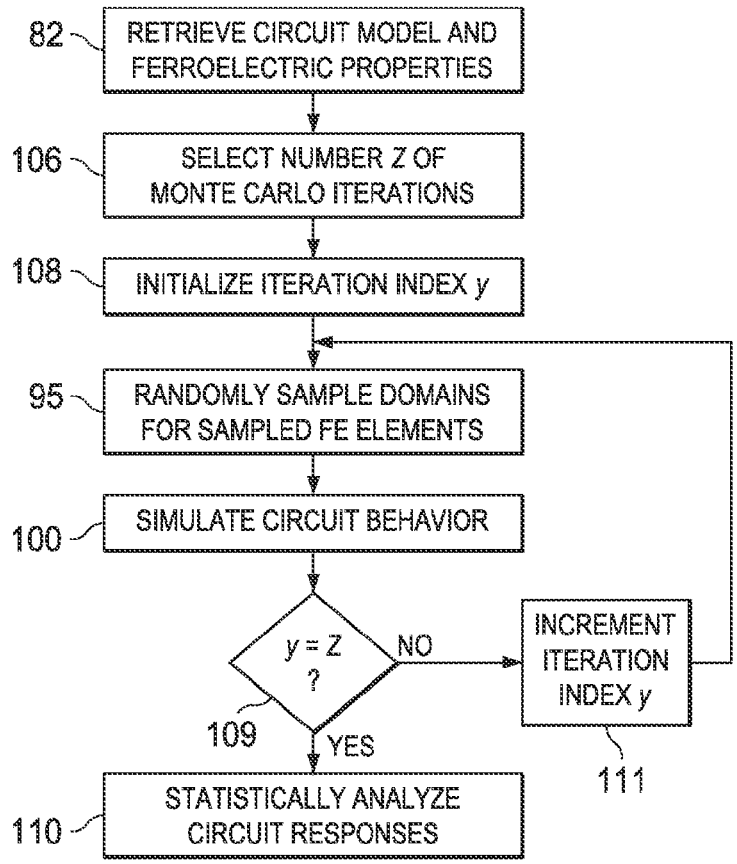
FIGS. 14a and 14c are flow diagrams illustrating the operation of embodiments of the invention in simulating the statistical variation of circuits including ferroelectric devices according to embodiments of this invention.

One approach to evaluation of the effects of random domain fluctuation is to perform a statistical analysis of the variability in circuit simulation results over a large number of sample instances. FIG. 14*a* illustrates a method of performing such statistical analysis using a Monte Carlo approach, according to an embodiment of this invention. Process 82 of FIG. 14*a* corresponds to the initial processes involved in setting up a circuit model for simulation, and as such includes processes 84, 86 described above relative to FIG. 12*a*. In process 106, the designer or analyst selects a number Z of Monte Carlo iterations of the circuit simulation to be performed, and communicates that number Z to simulation system 50 by way of the appropriate input device. In process 108, simulation system 50 initializes an iteration index y, and then defines the models for ferroelectric elements in the circuit being modeled by way of random sampling of their polarization characteristics in process 95, described above in connection with FIG. 12*a*.

Following the defining of the circuit model including randomly selected polarization characteristics via process 95, the operation of the modeled circuit in response to a desired stimulus is simulated in process 100, which in this embodiment of the invention, includes simulation processes 96, 98, 102, 104, and the corresponding decisions 97, 103 described above relative to FIG. 12*a*. The results of the simulation are stored in the appropriate memory resource of simulation system 50, as described above. Simulation system 50 executes decision 109 to determine whether the iteration index y has reached the desired number of iterations Z; if not (decision 109 is no), index y is incremented in process 11, and sampling process 95 and simulation process 100 is repeated for a next set of sampled ferroelectric elements. Upon completion of the desired number of iterations (decision 109 is yes), simulation system 50 can statistically analyze the circuit responses determined by the repeated simulations of process 100, in process 110.

FIG. 14*b* illustrates an example of the results of such analysis performed according to an approach such as that described above relative to FIG. 14*a*. FIG. 14*b* illustrates statistical distributions of the bit line voltages in an FRAM memory, for three iterations of processes 95, 100 in the approach of FIG. 14*a*. Curves 170, 174, 176 illustrate the bit line voltages for a stored "1" data state, across a population of columns in a relatively large FRAM memory, for three separate iterations of sampling process 95 and simulation process 100. Curves 178 illustrate the bit line voltages for a stored "0" state as simulated for these same three samples. As evident from FIG. 14*b*, random domain fluctuation does not greatly affect the bit line voltages for a stored "0" state, as the three distributions for the three iterations are close to one another and each exhibits a relatively tight distribution in and of itself (i.e., all bit lines in the same FRAM establish about the same "0" state bit line voltage). However, random domain fluctuation greatly affects the stored "1" state bit line voltages. Not only do the bit line voltage distributions for the three random sample instances differ significantly from one another, but also each bit line voltage distribution itself is quite wide; in other words, the "1" state bit line voltages within the same FRAM memory for a given sample vary widely. And, of course, the three sample instances significantly vary among one another, indicating that each population of FRAM memories will exhibit a wide distribution in "1" state bit line voltages, and thus perhaps in device performance.

The information conveyed by FIG. 14*b*, for example, and that is available by virtue of incorporating the effects of random domain fluctuation into the modeling and simulation of ferroelectric devices, according to embodiments of this invention, will be important to the designer and manufacturer of these devices. This information is not available or otherwise provided by previous modeling and simulation systems and methods in which ferroelectric elements are assumed to correspond to an average or large device. It is therefore contemplated that embodiments of these inventions will be useful in allowing the designer and manufacturer to evaluate and address variations in device performance caused by this effect.

Figure 14C:
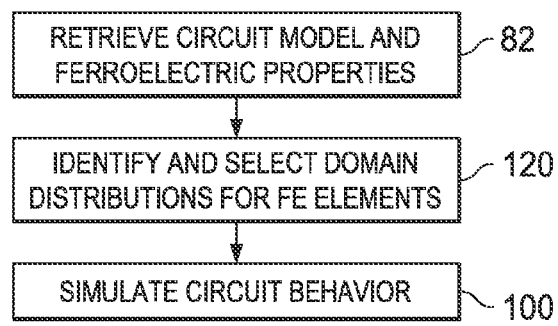

According to another embodiment of the invention, as will now be described in connection with FIG. 14*c*, the incorporation of random domain fluctuation into the ferroelectric circuit model enables the use of worst-case, or corner, simulation of the circuit. According to this approach, the initial processes involved in setting up a circuit model for simulation is performed in process 82. Rather than randomly sample the polarization distributions, however, according to this embodiment of the invention certain domain distributions are specifically selected by the designer or analyst, via simulation system 50, according to the particular situation to be simulated. For example, the designer or user may refer to a previous statistical distribution of polarization characteristics of ferroelectric capacitors 10, and select a pair of capacitors that exhibit a worst-case imbalance situation relative to one another. Or the designer or user may select polarization characteristics that may exhibit worst case performance for a particular voltage condition or manufacturing process variation. In any event, the circuit model is defined in process 120, using the specifically selected domain polarization characteristics for one or more of the ferroelectric capacitors 10. Process 100 is then performed, to simulate the operation of the modeled circuit in response to a desired stimulus. This approach to modeling and simulation thus allows the designer or user to investigate the behavior of the circuit in such worst case conditions, and thus enables the effect of these conditions to be addressed by way of design or other changes.

It has been observed, through actual simulation and physical measurement of actual devices, that the modeling of small ferroelectric capacitors according to embodiments of the invention, in particular by random sampling of a probability density function for a relatively small number of domains, closely matches the actual behavior of the actual devices. In other words, the variation in simulated response resulting from the random sampling of embodiments of this invention corresponds to the actual measured variation in electrical response of the corresponding integrated circuits. Not only does this invention thus provide accurate and faithful insight into the variations of actual integrated circuits, but this correspondence also indicates that, in the event that the models do not match the electrical behavior, the modeling approach can be calibrated in order to obtain proper matching. In that regard, it is believed that this calibration can be effected by way of adjusting the single parameter of the domain density value ρ. Because only this single calibration parameter is involved, matching of the model to the device is greatly facilitated.

IN CONCLUSION

Embodiments of this invention provide many advantages useful in the design and manufacture of integrated circuits that include ferroelectric capacitors or other ferroelectric devices. According to this invention, the accuracy of the models used in simulation of such circuits is substantially improved over conventional ferroelectric capacitor models. In particular, the discrete nature of polarization characteristics in small ferroelectric devices can readily be modeled, in a manner that closely resembles the actual mechanism of random domain fluctuation present in actual devices, and in a manner that is effectively automatic from the viewpoint of the system user. In addition, it is contemplated that the simulation of circuits including ferroelectric devices modeled in this manner can be efficiently carried out with modern computer systems of modest capability, at reasonable computing times. Embodiments of this invention thus enable the derivation and use of an accurate and efficient model for the complex behavior of integrated circuits with large number of small ferroelectric elements, with a high degree of accuracy and confidence.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of operating a computer system to create a model of a ferroelectric element for use in a computerized simulation of an electronic circuit including the ferroelectric element, comprising the steps of:
   measuring polarization behavior of at least one ferroelectric element;
   from the measured polarization behavior, deriving a probability distribution function of positive and negative coercive voltages at which domains of the ferroelectric element are polarized into polarization states, the probability distribution function represented by a numerical grid of a plurality of gridcells, each gridcell associated with positive and negative coercive voltage values and having a likelihood value assigned thereto;
   calculating an expected number of domains for each of the plurality of gridcells based on the likelihood value for the gridcell and a number of domains in the modeled ferroelectric element;
   randomly selecting a number of domains to be assigned to each gridcell for the modeled ferroelectric element according to its expected number of domains; and
   superposing polarization characteristics associated with each of the selected domains for the modeled ferroelectric element to create the model of the ferroelectric element.

2. The method of claim 1, further comprising:
   identifying a domain density per unit area for the at least one ferroelectric element; and
   identifying an area of the modeled ferroelectric element;
   and wherein the calculating step calculates the expected number of domains for each gridcell as the product of the likelihood value for the gridcell, the domain density, and the area of the modeled ferroelectric element.

3. The method of claim 1, further comprising:
   for each gridcell, defining a gridcell probability distribution according to the expected number of domains for that gridcell; and
   randomly selecting the number of domains to be assigned to that gridcell according to the gridcell probability distribution.

4. The method of claim 3, wherein the gridcell probability distribution follows a Poisson distribution.

5. The method of claim 3, further comprising:
   for each gridcell, evaluating at least one dipole moment value as the product of a nominal single-domain dipole moment and the randomly selected number of domains assigned to that gridcell, normalized by the expected number of domains for that gridcell;
   determining the polarization characteristic for each of the domains of the modeled ferroelectric element based on the evaluated dipole moment.

6. A method of operating a computer system to simulate the behavior of an electronic circuit including a ferroelectric element, comprising the steps of:
   retrieving, from a memory resource in the computer system, a model of the electronic circuit, including models of a plurality of circuit elements and connections among those circuit elements;
   creating a model of at least one ferroelectric element included in the model of the electronic circuit, the model representing the ferroelectric element as a plurality of independent polarizable domains, the creating step comprising:
      selecting a probability distribution function of positive and negative coercive voltages at which domains of the ferroelectric element are polarized into polarization states, the probability distribution function represented by a numerical grid of a plurality of gridcells, each gridcell associated with positive and negative coercive voltage values and having a likelihood value assigned thereto;
      calculating an expected number of domains for each of the plurality of gridcells based on the likelihood value for the gridcell and a number of domains in the modeled ferroelectric element;
      randomly selecting a number of domains to be assigned to each gridcell for the modeled ferroelectric element according to its expected number of domains; and
      superposing polarization characteristics associated with each of the selected domains for the modeled ferroelectric element;
   applying initial conditions and an assigned stimulus to nodes of the model of the electronic circuit, including the modeled ferroelectric element;
   summing the polarization characteristics over the selected domains in response to the assigned stimulus, to determine the polarization of the modeled ferroelectric element in response to the stimulus; and
   generating a simulation output based on the polarization from the summing step.

7. The method of claim 6, wherein the assigned stimulus comprises at least one applied voltage to the modeled ferroelectric element beyond a saturation level of at least one of the positive and negative coercive voltages, so that all domains are polarized to a polarization state.

8. The method of claim 7, further comprising:
then storing, in a memory resource of the system, the polarization state of each of the selected domains;
then, in response to a second assigned stimulus comprising at least one applied voltage to the modeled ferroelectric element between saturation levels of the positive and negative coercive voltages, summing the polarization over the selected domains to determine the polarization of the modeled ferroelectric element in response to the second assigned stimulus and for the stored polarization state; and
then storing, in a memory resource of the system, the polarization state of each of the plurality of domains from the step of summing the polarization over the plurality of domains evaluated at the second assigned stimulus;
wherein the step of generating an output generates the output based on the polarization from the step of summing the polarization over the plurality of domains evaluated at the second assigned stimulus.

9. The method of claim 6, wherein the creating step further comprises:
identifying a domain density; and
identifying an area of the modeled ferroelectric element; and wherein the calculating step calculates the expected number of domains for each gridcell as the product of the likelihood value for the gridcell, a domain density per unit area for the modeled ferroelectric element, and an area of the modeled ferroelectric element.

10. The method of claim 6, wherein the creating step further comprises:
for each gridcell, defining a gridcell probability distribution according to the expected number of domains for that gridcell; and
randomly selecting the number of domains to be assigned to that gridcell according to the gridcell probability distribution.

11. The method of claim 10, wherein the gridcell probability distribution follows a Poisson distribution.

12. The method of claim 10, wherein the creating step further comprises:
for each gridcell, evaluating at least one dipole moment value as the product of a nominal single-domain dipole moment and the randomly selected number of domains assigned to that gridcell, normalized by the expected number of domains for that gridcell;
determining the polarization characteristic for each of the domains of the modeled ferroelectric element based on the evaluated dipole moment.

13. The method of claim 6, wherein the modeled electronic circuit includes a plurality of ferroelectric elements;
and wherein the creating step is performed a plurality of times to create a model for each of the plurality of ferroelectric elements.

14. The method of claim 6, wherein the creating, applying, summing, and generating steps are performed repeatedly over a plurality of iterations; and wherein the generating step comprises:
performing a statistical analysis of the results of the simulation outputs over the plurality of iterations.

15. The method of claim 6, wherein the creating step is repeated a plurality of iterations; and further comprising:
after the repeated creating step, defining a model for the modeled ferroelectric element according to the polarization characteristics of a selected one of the plurality of iterations of the repeated creating step.

16. A non-transitory computer-readable medium storing a computer program that, when executed on a computer system, causes the computer system to perform a sequence of operations for simulating the behavior of an electronic circuit including a ferroelectric element, the sequence of operations comprising:
retrieving, from a memory resource in the computer system, a model of the electronic circuit, including models of a plurality of circuit elements and connections among those circuit elements;
creating a model of at least one ferroelectric element included in the model of the electronic circuit, the model representing the ferroelectric element as a plurality of independent polarizable domains, by executing a plurality of operations comprising:
selecting a probability distribution function of positive and negative coercive voltages at which domains of the ferroelectric element are polarized into polarization states, the probability distribution function represented by a numerical grid of a plurality of gridcells, each gridcell associated with positive and negative coercive voltage values and having a likelihood value assigned thereto;
calculating an expected number of domains for each of the plurality of gridcells based on the likelihood value for the gridcell and a number of domains in the modeled ferroelectric element;
randomly selecting a number of domains to be assigned to each gridcell for the modeled ferroelectric element according to its expected number of domains; and
superposing polarization characteristics associated with each of the selected domains for the modeled ferroelectric element;
applying initial conditions and an assigned stimulus to nodes of the model of the electronic circuit, including the modeled ferroelectric element;
summing the polarization characteristics over the selected domains in response to the assigned stimulus, to determine the polarization of the modeled ferroelectric element in response to the stimulus; and
generating a simulation output based on the polarization from the summing operation.

17. The non-transitory computer-readable medium of claim 16, wherein the assigned stimulus comprises at least one applied voltage to the modeled ferroelectric element beyond a saturation level of at least one of the positive and negative coercive voltages, so that all domains are polarized to a polarization state.

18. The non-transitory computer-readable medium of claim 17, further comprising:
then storing, in a memory resource of the system, the polarization state of each of the selected domains;
then, in response to a second assigned stimulus comprising at least one applied voltage to the modeled ferroelectric element between saturation levels of the positive and negative coercive voltages, summing the polarization over the selected domains to determine the polarization of the modeled ferroelectric element in response to the second assigned stimulus and for the stored polarization state; and
then storing, in a memory resource of the system, the polarization state of each of the plurality of domains from the summing of the polarization characteristics over the plurality of domains evaluated at the second assigned stimulus;
wherein the step of generating an output generates the output based on the polarization from the step of summing the polarization over the plurality of domains evaluated at the second assigned stimulus.

19. The non-transitory computer-readable medium of claim 16, wherein the creating operation further comprises:
identifying a domain density; and
identifying an area of the modeled ferroelectric element;
and wherein the calculating operation calculates the expected number of domains for each gridcell as the product of the likelihood value for the gridcell, a domain density per unit area for the modeled ferroelectric element, and an area of the modeled ferroelectric element.

20. The non-transitory computer-readable medium of claim 16, wherein the creating operation further comprises:
for each gridcell, defining a gridcell probability distribution according to the expected number of domains for that gridcell; and
randomly selecting the number of domains to be assigned to that gridcell according to the gridcell probability distribution.

21. The non-transitory computer-readable medium of claim 20, wherein the creating operation further comprises:
for each gridcell, evaluating at least one dipole moment value as the product of a nominal single-domain dipole moment and the randomly selected number of domains assigned to that gridcell, normalized by the expected number of domains for that gridcell;
determining the polarization characteristic for each of the domains of the modeled ferroelectric element based on the evaluated dipole moment.

22. The non-transitory computer-readable medium of claim 16, wherein the modeled electronic circuit includes a plurality of ferroelectric elements;
and wherein the creating operation is performed a plurality of times to create a model for each of the plurality of ferroelectric elements.

23. The non-transitory computer-readable medium of claim 16, wherein the creating, applying, summing, and generating operations are performed repeatedly over a plurality of iterations; and wherein the generating step comprises:
performing a statistical analysis of the results of the simulation outputs over the plurality of iterations.

24. The non-transitory computer-readable medium of claim 16, wherein the creating operation is repeated a plurality of iterations; and further comprising:
after the repeated creating operation, defining a model for the modeled ferroelectric element according to the polarization characteristics of a selected one of the plurality of iterations of the repeated creating operation.

* * * * *